(12) United States Patent
Kondo

(10) Patent No.: US 9,060,455 B2
(45) Date of Patent: Jun. 16, 2015

(54) WIRING BOARD AND METHOD OF MANUFACTURING THE SAME

(75) Inventor: Hitoshi Kondo, Nagano (JP)

(73) Assignee: SHINKO ELECTRIC INDUSTRIES CO., LTD., Nagano-shi, Nagano (JP)

(*) Notice: Subject to any disclaimer, the term of this patent is extended or adjusted under 35 U.S.C. 154(b) by 243 days.

(21) Appl. No.: 13/604,833

(22) Filed: Sep. 6, 2012

(65) Prior Publication Data

US 2013/0062108 A1 Mar. 14, 2013

(30) Foreign Application Priority Data

Sep. 12, 2011 (JP) .................. 2011-198564

(51) Int. Cl.
*H05K 3/38* (2006.01)
*H05K 3/40* (2006.01)
*H05K 3/46* (2006.01)
*H01L 23/498* (2006.01)
*H01L 21/48* (2006.01)
*H05K 3/20* (2006.01)

(52) U.S. Cl.
CPC .............. *H05K 3/387* (2013.01); *H05K 3/388* (2013.01); *H05K 3/4069* (2013.01); *H05K 3/205* (2013.01); *H05K 3/4682* (2013.01); *H05K 2201/0195* (2013.01); *H01L 2224/16225* (2013.01); *H01L 2224/32225* (2013.01); *H01L 2224/73204* (2013.01); *H01L 2224/81193* (2013.01); *H01L 2924/01322* (2013.01); *H01L 23/49822* (2013.01); *H01L 21/4857* (2013.01)

(58) Field of Classification Search
CPC ..... H05K 3/389; H05K 3/4069; H05K 3/388; H01L 23/49822

USPC .................................................. 174/250–268
See application file for complete search history.

(56) References Cited

U.S. PATENT DOCUMENTS 6,326,556 B1* 12/2001 Asai et al. ............... 174/255
6,440,542 B1* 8/2002 Kariya ..................... 428/209
(Continued)

FOREIGN PATENT DOCUMENTS

JP 2003-332734 A 11/2003
JP 2007-96260 4/2007
(Continued)

OTHER PUBLICATIONS

A Japanese Office Action (with English-language translation) dated Mar. 17, 2015 that issued in Japanese patent application No. 2011-198564.

*Primary Examiner* — Tuan T Dinh
*Assistant Examiner* — Steven T Sawyer
(74) *Attorney, Agent, or Firm* — Drinker Biddle & Reath LLP

(57) ABSTRACT

A wiring board includes: a first wiring layer; a first insulating layer formed on the first wiring layer and including a reinforcing material therein, the first insulating layer having a first opening; a contact layer formed on the first insulating layer and having a second opening communicated with the first opening; and a second wiring layer comprising a second via and a second wiring pattern connected to the second via. The second wiring pattern is formed on the contact layer, and the second via is filled in the first and second openings. An adhesion property between the contact layer and the second wiring pattern is higher than that between the first insulating layer and the second wiring pattern, and a thickness of the contact layer is smaller than that of the first insulating layer.

15 Claims, 17 Drawing Sheets

(56) References Cited

U.S. PATENT DOCUMENTS

| | | | |
|---|---|---|---|
| 6,566,422 B1 * | 5/2003 | Yagi et al. | 523/440 |
| 6,831,235 B1 * | 12/2004 | Enomoto et al. | 174/262 |
| 8,129,626 B2 | 3/2012 | Ueda et al. | |
| 2001/0040794 A1 * | 11/2001 | Shimizu et al. | 361/749 |
| 2002/0045394 A1 * | 4/2002 | Noda et al. | 442/180 |
| 2002/0189856 A1 * | 12/2002 | Takenaka et al. | 174/255 |
| 2005/0281995 A1 * | 12/2005 | Murai et al. | 428/209 |
| 2007/0013067 A1 * | 1/2007 | Nishida et al. | 257/737 |
| 2007/0119619 A1 | 5/2007 | Nakamura et al. | |
| 2007/0246254 A1 * | 10/2007 | Kumar et al. | 174/264 |
| 2010/0276187 A1 * | 11/2010 | Nakamura et al. | 174/258 |

FOREIGN PATENT DOCUMENTS

| | | |
|---|---|---|
| JP | 2009-088429 A | 4/2009 |
| JP | 2009-224739 A | 10/2009 |
| JP | 2010-129942 A | 6/2010 |
| JP | 2011-051247 A | 3/2011 |
| JP | 2011-086729 A | 4/2011 |

* cited by examiner

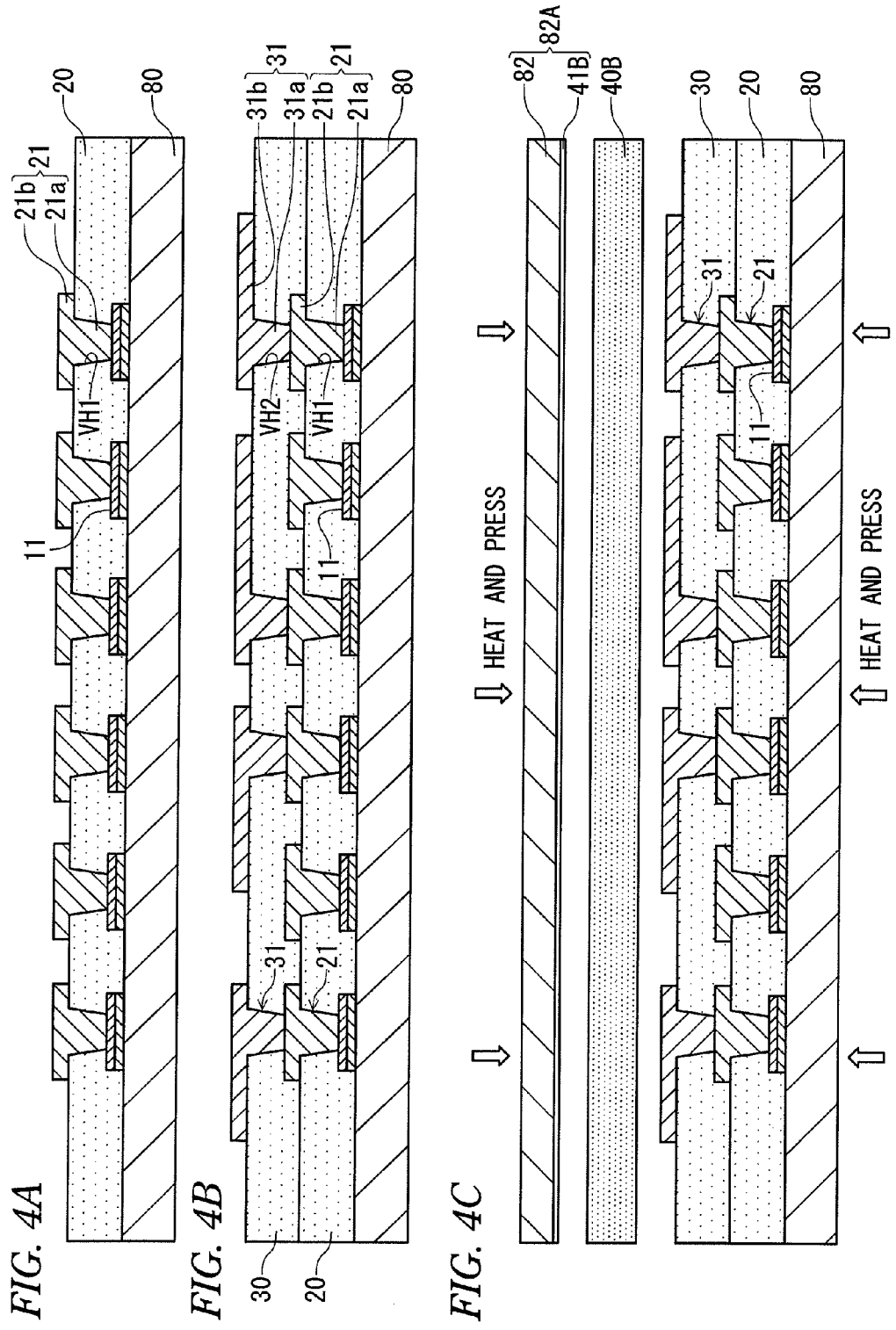

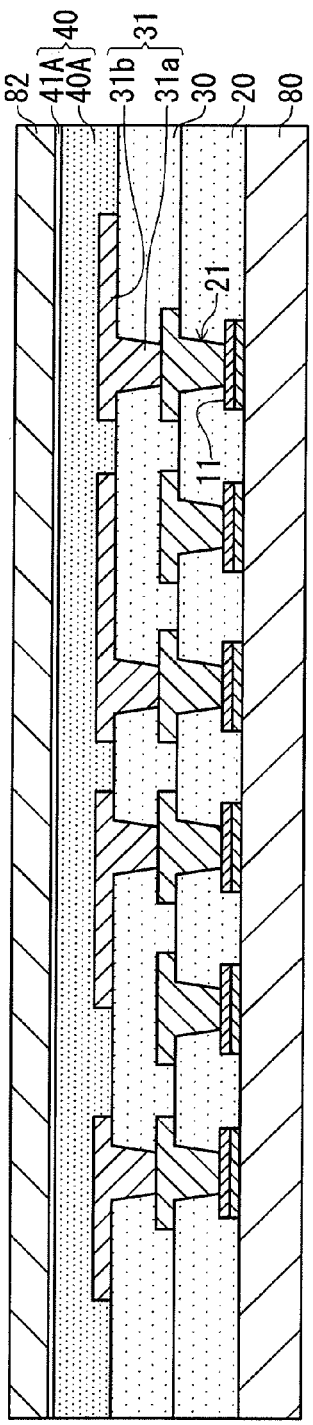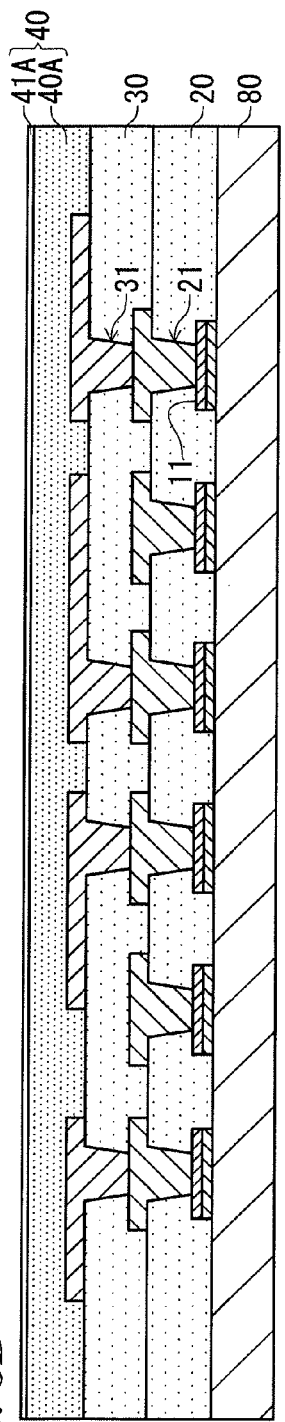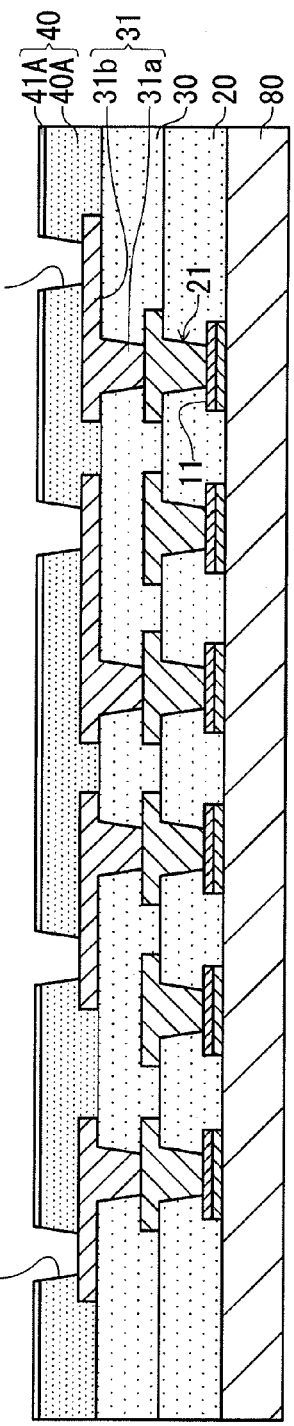

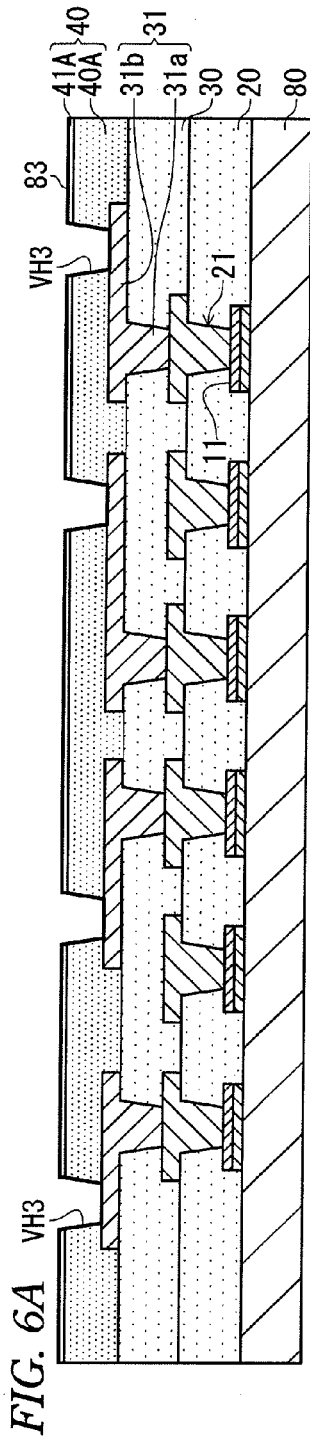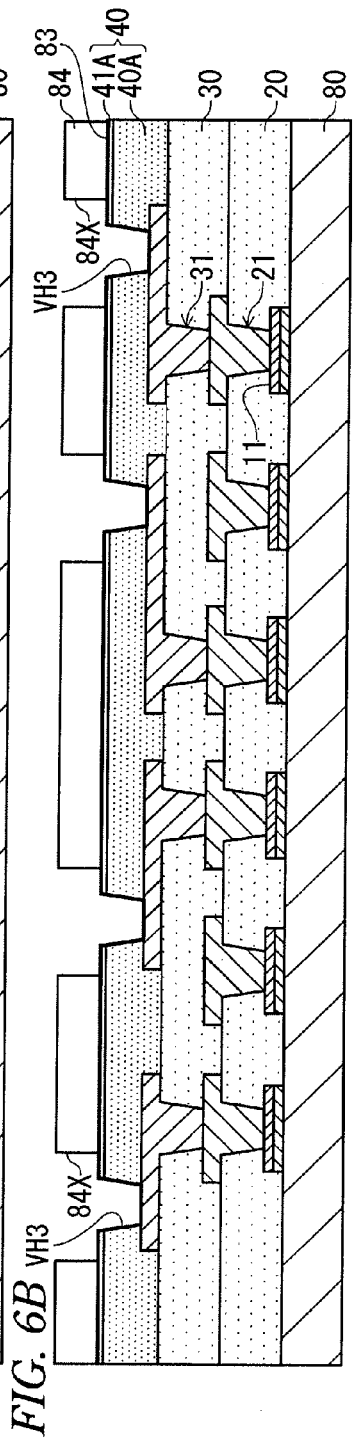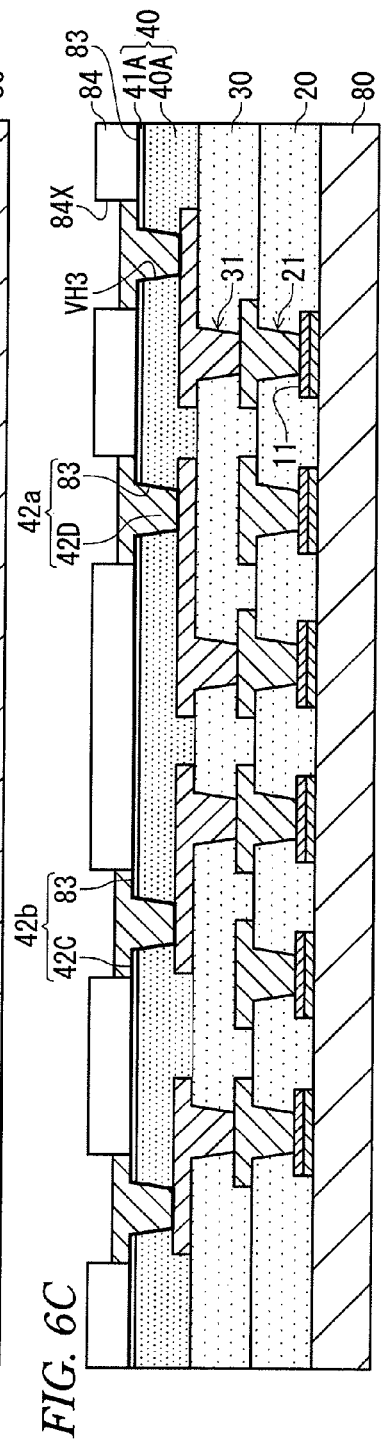

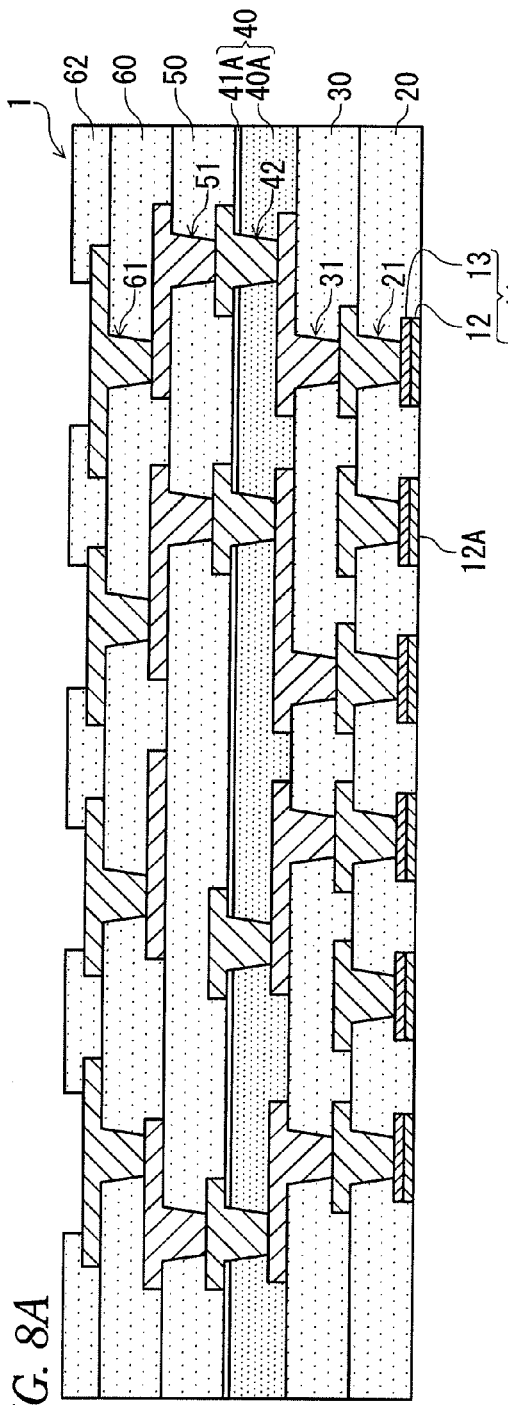
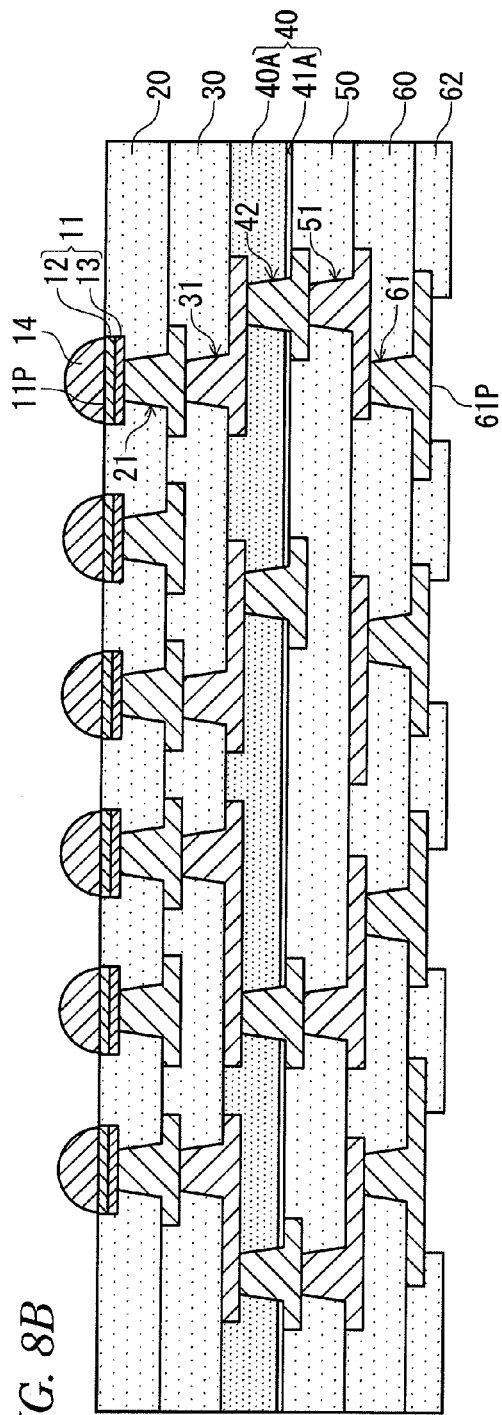
FIG. 8A
FIG. 8B

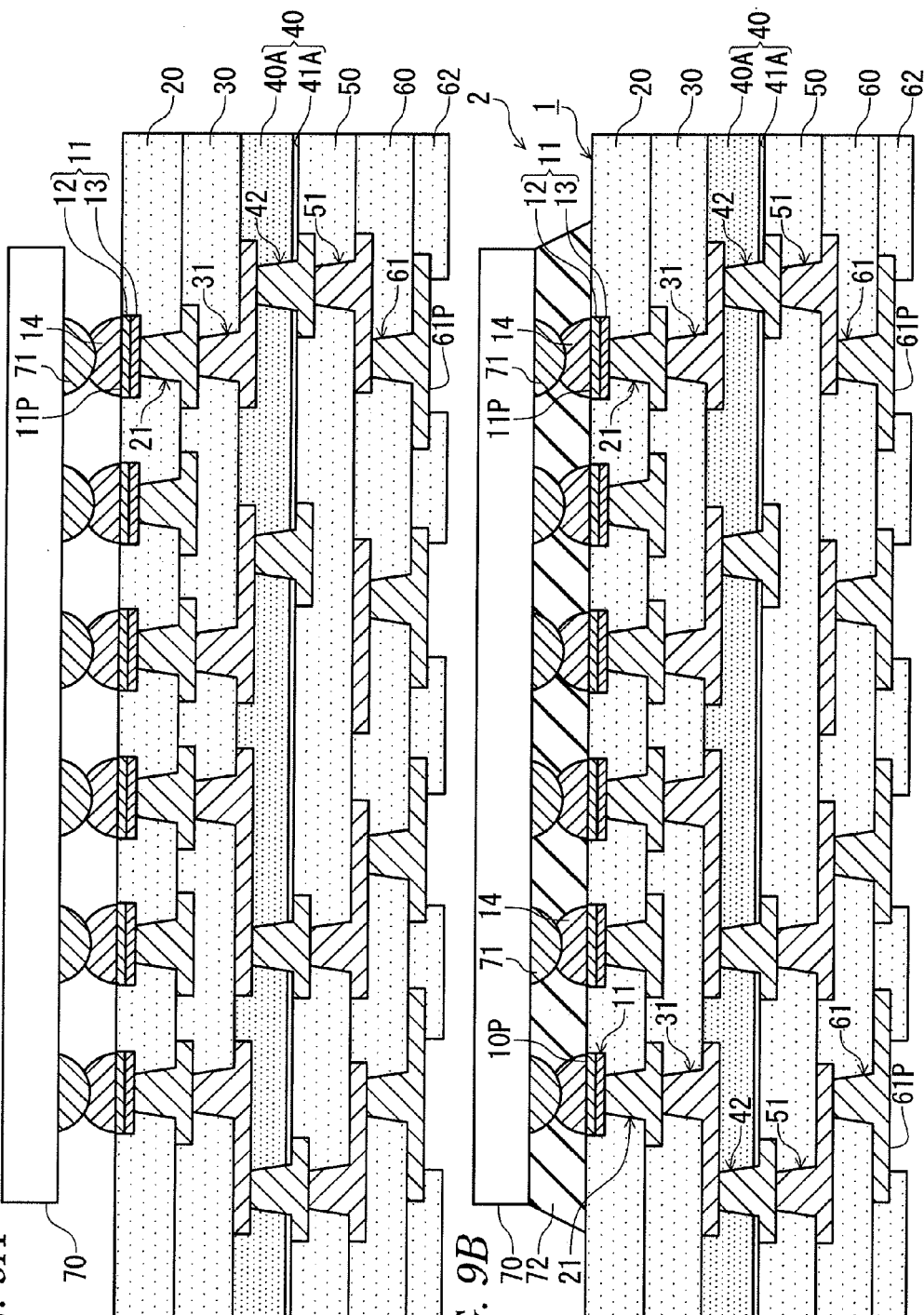

FIG. 12A
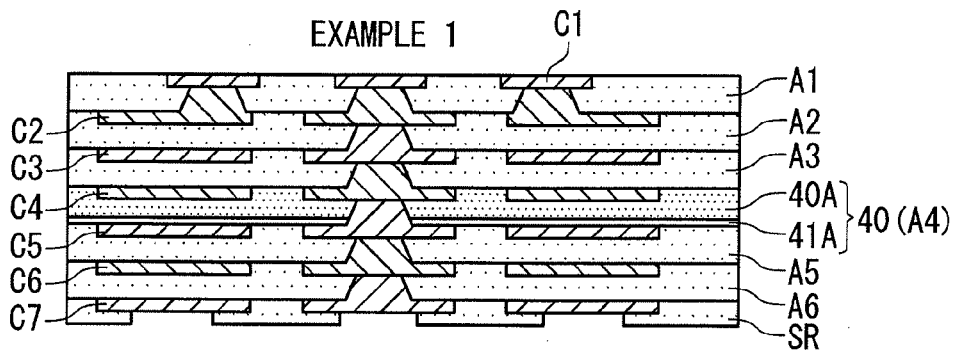
EXAMPLE 1
FIG. 12B
| | LAYER THICKNESS [μm] | Cu AREA [mm²] | REMAINING COPPER RATIO [%] |
|---|---|---|---|
| C1 | 15 | 27.7 | 1.5 |
| A1 | 15 | | 0.0 |
| C2 | 15 | 1247.0 | 66.8 |
| A2 | 30 | | 0.0 |
| C3 | 15 | 1653.3 | 88.6 |
| A3 | 30 | | 0.0 |
| C4 | 15 | 1163.1 | 62.3 |
| A4 | 40 | | 0.0 |
| C5 | 15 | 1538.8 | 82.5 |
| A5 | 30 | | 0.0 |
| C6 | 15 | 1419.8 | 76.1 |
| A6 | 30 | | 0.0 |
| C7 | 15 | 1534.4 | 82.2 |
| SR | 15 | | 0.0 |
FIG. 12C
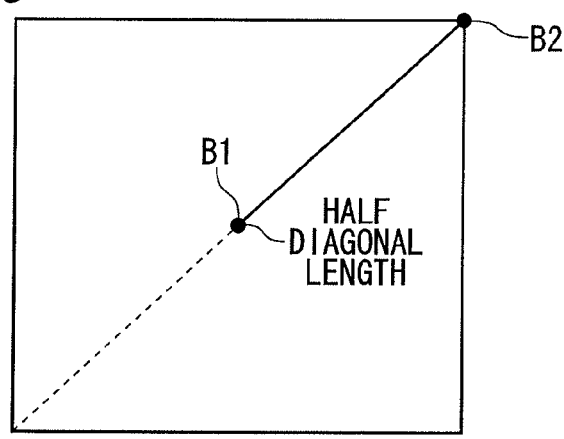

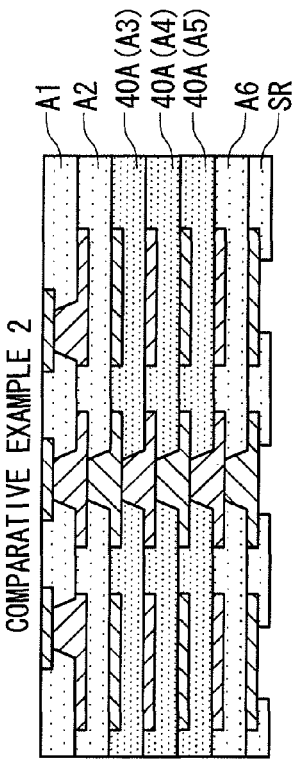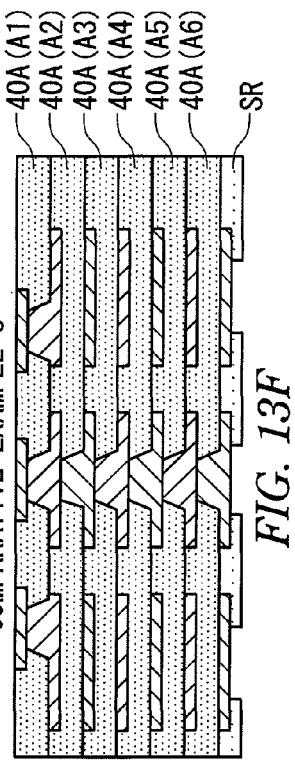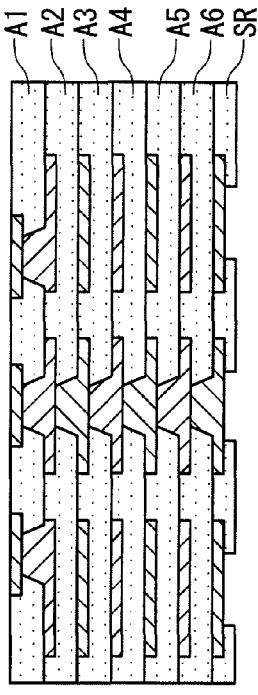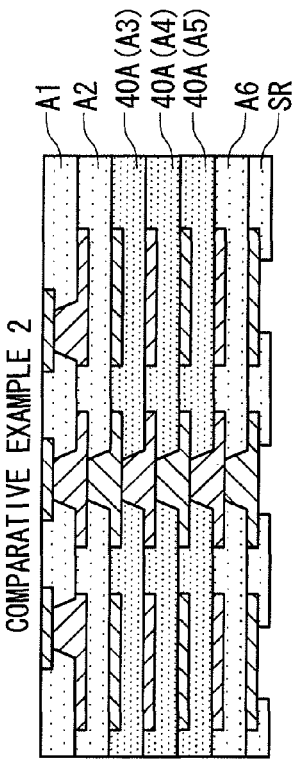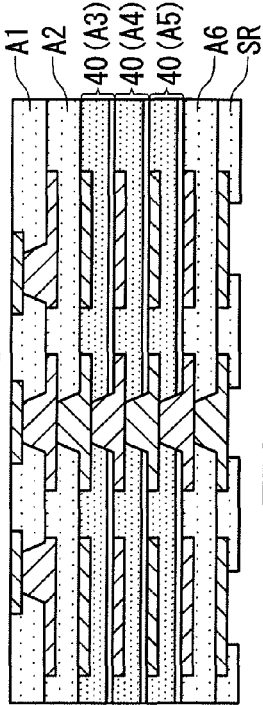

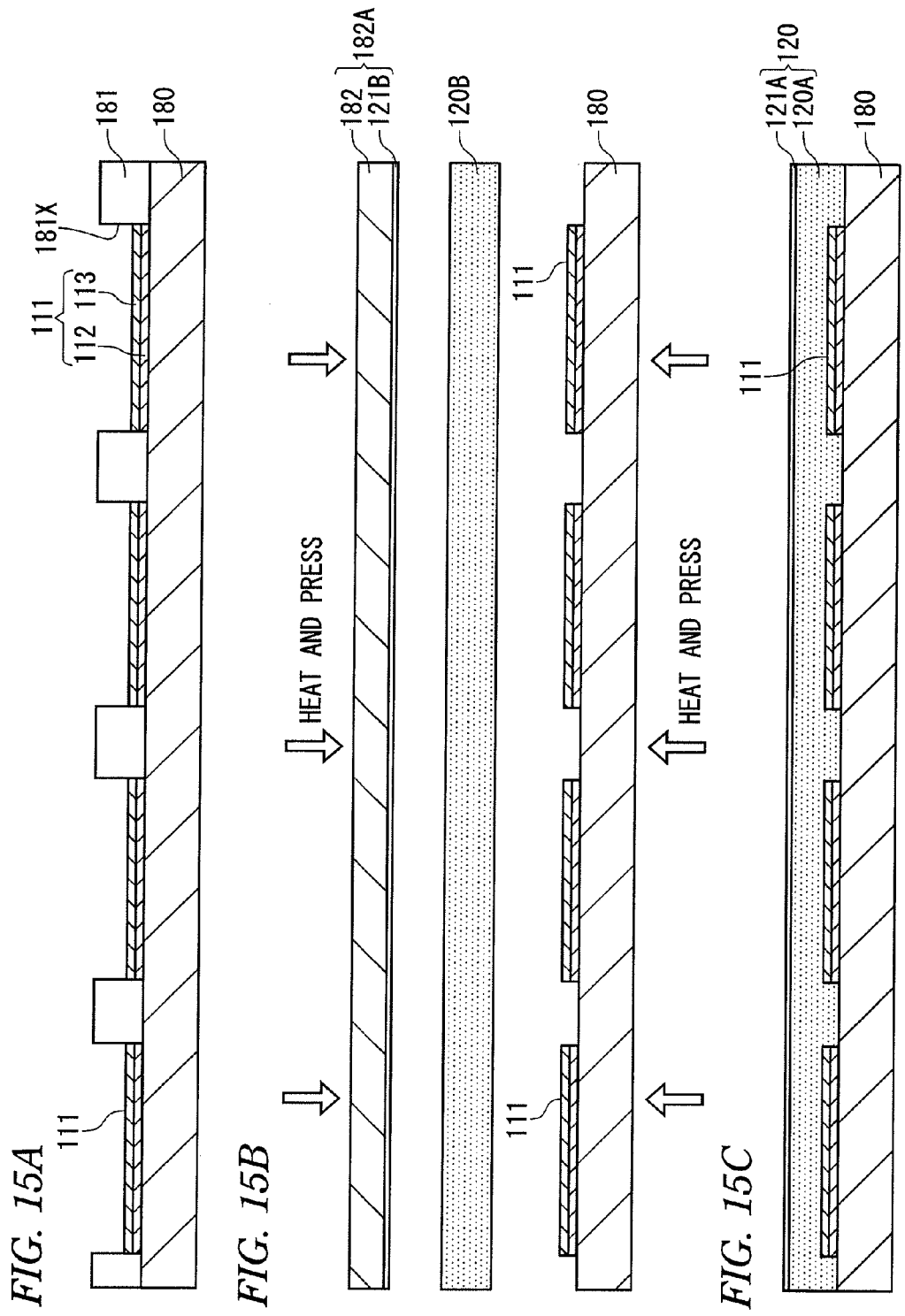

_US 9,060,455 B2_

WIRING BOARD AND METHOD OF MANUFACTURING THE SAME

This application claims priority from Japanese Patent Application No. 2011-198564, filed on Sep. 12, 2011, the entire contents of which are herein incorporated by reference.

BACKGROUND

1. Technical Field

Embodiments described herein relate to a wiring board and a method for manufacturing the wiring board.

2. Related Art

Increase in density of a mounted semiconductor chip has heretofore advanced, so that reduction in thickness of a wiring board and increase in density of wiring patterns have been required. To meet such requirements, a wiring board after removal of a core board (support board) having high rigidity and thicker than an interlayer insulating film, that is, a so-called coreless board has been proposed.

In a basic process of the coreless board, a temporary board is first prepared as a support board. A wiring layer serving as pads is formed on the temporary board. Then, after a required number of wiring layers and insulating layers are built up, the temporary board is finally removed.

A technique of providing any one of formed insulating layers in this type coreless board as an insulating layer improved in mechanical strength by a reinforcing material to reduce warping of the board has been proposed recently (e.g. see JP-A-2007-96260).

However, in the wiring board having the reinforcing material-containing insulating layer, there is a problem that fine wirings cannot be formed on the reinforcing material-containing insulating layer. To describe in detail, for example, when wiring patterns are formed on the reinforcing material-containing insulating layer by a semi-additive method, the upper surface of the insulating layer is etched by desmear processing so that the roughness of the upper surface of the insulating layer becomes large (e.g. about 800 nm to about 1000 nm in terms of surface roughness Ra value). When the upper surface (front surface) is roughened in this manner, it is difficult to form fine wirings on the upper surface with high accuracy. Specifically, it is difficult to form fine wirings of L/S (Line/Space)=15 μm/15 μm or less on the reinforcing material-containing insulating layer with high accuracy after the desmear processing.

SUMMARY OF THE INVENTION

According to one or more illustrative aspects of the present invention, there is provided a wiring board. The wiring board comprises: a first wiring layer; a first insulating layer formed on the first wiring layer and comprising a reinforcing material therein, the first insulating layer having a first opening; a contact layer formed on the first insulating layer and having a second opening communicated with the first opening, wherein the first wiring layer is exposed through the first and second openings; and a second wiring layer comprising a second via and a second wiring pattern connected to the second via, wherein the second wiring pattern is formed on the contact layer, and the second via is filled in the first and second openings. An adhesion property between the contact layer and the second wiring pattern is higher than an adhesion property between the first insulating layer and the second wiring pattern, and a thickness of the contact layer is smaller than that of the first insulating layer.

According to one or more illustrative aspects of the present invention, there is provided a wiring board. The wiring board comprises: a plurality of multilayer wiring structures stacked one on top of another. Each of the plurality of multilayer wiring structures comprises: an insulating layer comprising a reinforcing material therein, the insulating layer having a first opening; a contact layer formed on the insulating layer and having a second opening communicated with the first opening; and a wiring layer comprising a via and a wiring pattern connected to the via, wherein the wiring pattern is formed on the contact layer, and the via is filled in the first and second openings. An adhesion property between the contact layer and the wiring pattern is higher than an adhesion property between the insulating layer and the wiring pattern, and a thickness of the contact layer is smaller than that of the insulating layer.

According to one or more illustrative aspects of the present invention, there is provided a method of manufacturing a wiring board. The method comprises: (a) forming a multilayer wiring structure comprising a first wiring layer and a first insulating layer on a support board; (b) forming a second insulating layer comprising a reinforcing material therein on the multilayer wiring structure; (c) forming a contact layer on the second insulating layer; (d) forming a hole through the second insulating layer and the contact layer to expose the first wiring layer; (e) forming a second wring layer in the hole and on the contact layer; and (f) removing the support board. An adhesion property between the contact layer and the second wiring layer is higher than an adhesion property between the second insulating layer and the second wiring layer, and a thickness of the contact layer is smaller than that of the second insulating layer.

Other aspects and advantages of the present invention will be apparent from the following description, the drawings and the claims.

BRIEF DESCRIPTION OF THE DRAWINGS

FIGS. 4A to 4C are schematic sectional views showing the method of manufacturing the wiring board according to the first embodiment;

FIGS. 5A to 5C are schematic sectional views showing the method of manufacturing the wiring board according to the first embodiment;

FIGS. 6A to 6C are schematic sectional views showing the method of manufacturing the wiring board according to the first embodiment;

FIG. 8A is a schematic sectional views showing the method of manufacturing the wiring board according to the first embodiment;

FIG. 8B is a schematic sectional view showing a method of manufacturing a semiconductor package according to the first embodiment;

FIGS. 9A and 9B are schematic sectional views showing the method of manufacturing the semiconductor package according to first embodiment;

FIG. 12A is a schematic sectional view showing a wiring board according to Example 1;

FIG. 12B is a table showing simulation conditions;

FIG. 12C is an explanatory view showing a method for measuring warping;

FIGS. 13A to 13F are schematic sectional views showing wiring boards according to Examples 2 and 3 and Comparative Examples 1 to 4;

FIGS. 15A to 15C are schematic sectional views showing a method of manufacturing the wiring board according to the second embodiment;

DETAILED DESCRIPTION OF EXEMPLARY EMBODIMENTS

Figure 1:
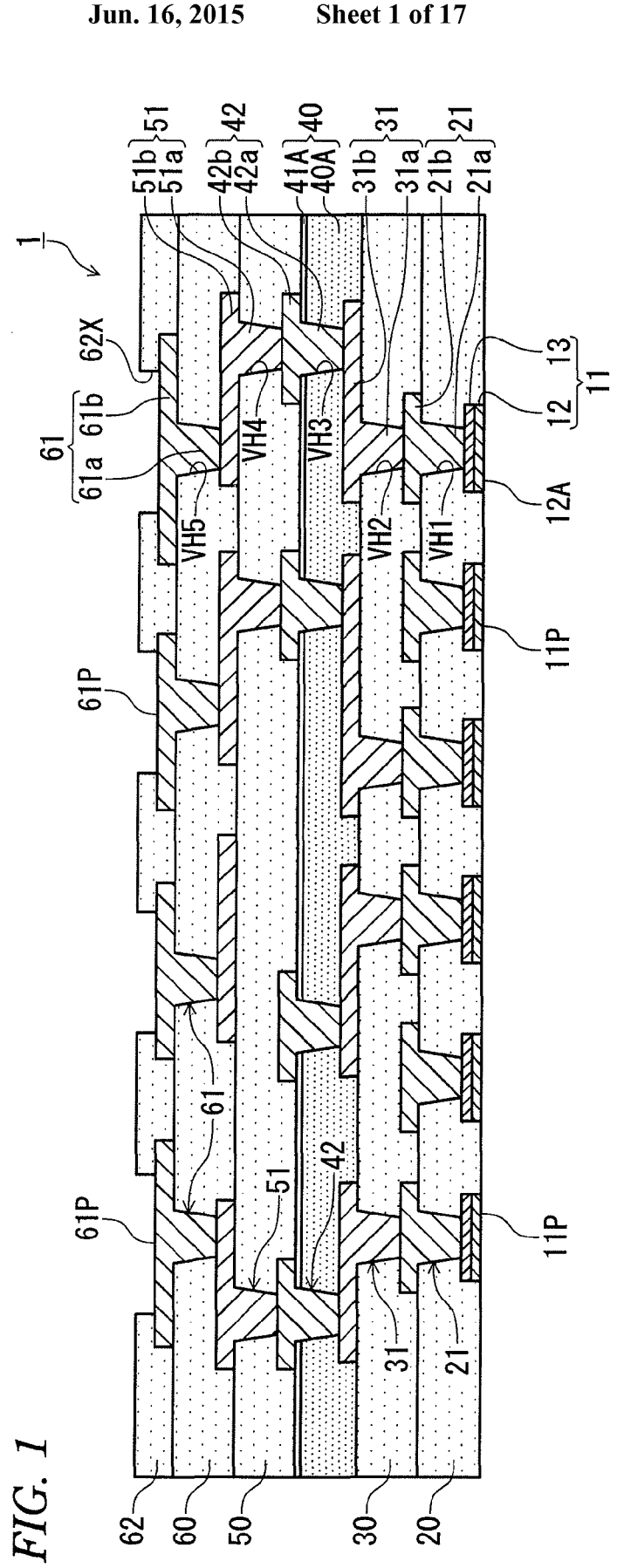
FIG. 1 is a schematic sectional view showing a wiring board according to a first embodiment.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

First Embodiment

A first embodiment will be described below with reference to FIGS. 1, 2, 3A-3E, 4A-4C, 5A-5C, 6A-6C, 7A-7B, 8A-8B and 9A-9B.

Structure of Wiring Board According to First Embodiment

The structure of a wiring board 1 will be described first.

As shown in FIG. 1, the wiring board 1 has such a structure that a first wiring layer 11, a first insulating layer 20, a second wiring layer 21, a second insulating layer 30, a third wiring layer 31, a third insulating layer 40, a fourth wiring layer 42, a fourth insulating layer 50, a fifth wiring layer 51, a fifth insulating layer 60 and a sixth wiring layer 61 are formed successively. In this manner, the wiring board 1 according to this embodiment has the form of a "coreless board" not containing any support base material differently from a wiring board (a laminate obtained in such a manner that a required number of build-up layers are formed successively on both surfaces or one surface of a core board as a support base material) produced by a general build-up method.

Incidentally, metal such as copper, copper alloy, etc. can be used as the material of each of the second to sixth wiring layers 21, 31, 42, 51 and 61.

In the wiring board 1, the first wiring layer 11 is formed as the lowermost layer in FIG. 1. The first wiring layer 11 has a first conductive layer 12, and a second conductive layer 13. For example, a conductive layer in which a gold (Au) film, a palladium (Pd) film and a nickel (Ni) film are formed successively in this order so that the Au film is exposed out of the wiring board 1 can be used as the first conductive layer 12. For example, a conductive layer containing a copper (Cu) layer or the like can be used as the second conductive layer 13.

Figure 2:
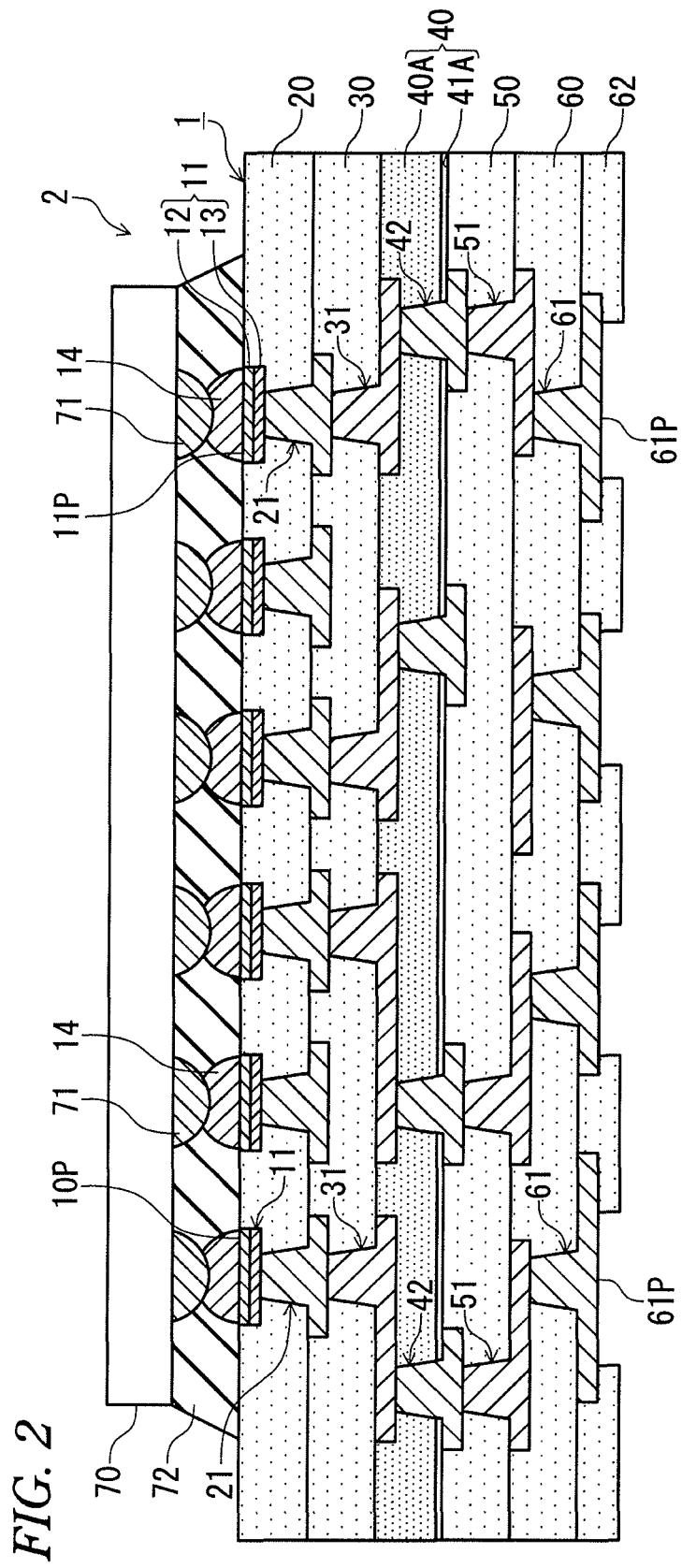
FIG. 2 is a schematic sectional view showing a semiconductor package in the first embodiment.

Parts of the first wiring layer 11, that is, a first principal surface 12A (a lower surface in the drawing) of the first conductive layer 12 are exposed out of the first insulating layer 20 and serve as electrode pads 11P electrically connected to a semiconductor chip 70 (see FIG. 2). That is, in this embodiment, a surface where the electrode pads 11P are formed is provided as a chip mount surface. For example, the planer shape of the first wiring layer 11 exposed out of the first insulating layer 20 is circular. For example, the diameter of each circle can be set to be in a range of about 40 µm to about 120 µm. For example, the pitch of the first wiring layer 11 exposed out of the first insulating layer 20 can be set to be in a range of about 100 µm to about 200 µm. For example, the thickness of the first wiring layer 11 can be set to be in a range of about 10 µm to about 20 µm.

The first insulating layer 20 is formed so that a second principal surface (an upper surface in the drawing) and side surfaces of the first wiring layer 11 are covered but the first principal surface 12A of the first wiring layer 11 is exposed. An epoxy-based insulating resin having thermosetting characteristic can be used as the material of the first insulating layer 20. Incidentally, the insulating resin is not limited to a resin having thermosetting characteristic but an insulating resin having photosensitivity may be used. For example, the thickness of the first insulating layer 20 can be set to be in a range of about 15 µm to about 35 µm.

The second wiring layer 21 is formed on the first insulating layer 20. The second wiring layer 21 has via-wirings 21a packed in via-holes VH1 which are formed through the first insulating layer 20 to expose the upper surface of the first wiring layer 11, and wiring patterns 21b formed on the first insulating layer 20. The via-wirings 21a are electrically connected to the first wiring layer 11 (exposed in the bottoms of the via-holes VH1). Incidentally, each of the via-holes VH1 and the via-wirings 21a formed in the via-holes VH1 is tapered to have a shape having its diameter increasing as the position goes from the lower side (electrode pad 11P (chip mount surface) side) to the upper side (sixth wiring layer 61 side) in FIG. 1. For example, the thickness of the wiring patterns 21b of the second wiring layer 21 can be set to be in a range of about 20 µm to about 35 µm.

The second insulating layer 30 is formed on the first insulating layer 20 so that the second wiring layer 21 is covered with the second insulating layer 30. For example, an insulating resin having the same composition as that of the first insulating layer 20 can be used as the material of the second insulating layer 30. For example, the thickness of the second insulating layer 30 can be set to be in a range of about 15 µm to about 35 µm.

The third wiring layer 31 is formed on the second insulating layer 30. The third wiring layer 31 has via-wirings 31a packed in via-holes VH2 which are formed through the second insulating layer 30 to expose the upper surface of the second wiring layer 21, and wiring patterns 31b formed on the second insulating layer 30. The via-wirings 31a are electrically connected to the second wiring layer 21 exposed in the bottoms of the via-holes VH2. Incidentally, each of the via-holes VH2 and the via-wirings 31a is tapered to have a shape having its diameter increasing as the position goes from the lower side to the upper side in FIG. 1. For example, the thickness of the wiring patterns 31b of the third wiring layer 31 can be set to be in a range of about 20 µm to about 35 µm.

The third insulating layer 40 has an insulating layer 40A, and a contact layer 41A. The insulating layer 40A is formed on the second insulating layer 30 so that the upper surface and side surfaces of the third wiring layer 31 (specifically, the wiring patterns 31b) are covered with the insulating layer 40A. The insulating layer 40A is a reinforcing material-containing insulating layer, i.e. an insulating layer higher in mechanical strength (rigidity, hardness, etc.) than the other insulating layers 20, 30, 50 and 60. For example, an insulating resin obtained by adding a reinforcing material into a thermosetting resin can be used as the material of the insulating layer 40A. Specifically, a reinforcing material-containing insulating resin obtained by impregnating woven or unwoven fabric of glass, aramid or LCP (Liquid Crystal Polymer) fiber with an epoxy-based or polyimide-based thermosetting resin can be used as the material of the insulating layer 40A. It is preferable that an insulating resin adjusted so that the glass transition temperature Tg of the insulating layer 40A is higher (e.g. about 200° C. to 250° C.) than the glass transition temperature Tg (e.g. about 150° C.) of the other insulating layers 20, 30, 50 and 60 is used as the material of the insulating layer 40A. It is more preferable that an insulating resin adjusted so that the thermal expansion coefficient of the insulating layer 40A becomes close to the thermal expansion coefficient (e.g. about 17 ppm/° C.) of copper which is the material of each of the third and fourth wiring layers 31 and 42 is used as the material of the insulating layer 40A. Incidentally, for example, the thickness of the insulating layer 40A can be set to be in a range of about 30 μm to about 60 μm. It is preferable from the viewpoint of improving mechanical strength that the insulating layer 40A is formed to be thicker than the other insulating layers 20, 30, 50 and 60 containing no reinforcing material.

The contact layer 41A is formed on the insulating layer 40A so that the upper surface of the insulating layer 40A is covered with the contact layer 41A. The contact layer 41A is an insulating layer which is higher in the degree of adhesion to a metal film (e.g. electroless plating) than the insulating layer 40A and which is thinner than the insulating layer 40A. The contact layer 41A can be formed so as to be thinner than the wiring patterns 42b of the fourth wiring layer 42 formed on the contact layer 41A. That is, because the contact layer 41A is formed on the insulating layer 40A which covers the third wiring layer 31 as a lower layer, and the contact layer 41A does not have to cover the wiring layer to keep insulation between formed wiring layers, unlike the insulating layer 40A and the other insulating layers 20, etc., the contact layer 41A can be formed so as to be thinner than the wiring patterns 42b. For this reason, it is preferable from the viewpoint of reduction in thickness of the wiring board 1 that the contact layer 41A is set to be thinner than the wiring patterns 42b. Speaking more, it is preferable from the viewpoint of reduction in warp of the wiring board 1 that the contact layer 41A is set to be sufficiently thinner than the insulating layer 40A. Specifically, it is preferable that the thickness of the contact layer 41A is not larger than 17% of the thickness of the insulating layer 40A, and it is more preferable that the thickness of the contact layer 41A is not larger than 10% of the thickness of the insulating layer 40A. For example, the thickness of the contact layer 41A can be set to be in a range of about 0.5 μm to about 5 μm.

For example, an insulating resin containing a thermosetting resin containing an epoxy-based resin as its main component, and an inorganic filler can be used as the material of the contact layer 41A. Specifically, an insulating resin having a composition (e.g. epoxy resin and inorganic filler contents) adjusted so that the peel strength when the contact layer 41A is electrolessly plated is at least higher than the peel strength (e.g. 100 to 200 N/m) when the insulating layer 40A is electrolessly plated is preferred as the material of the contact layer 41A. The term "peel strength" mentioned herein means a value (strength of peeling) indicating adhesion force between a conductor pattern (electroless plating) and an insulating layer. The peel strength is expressed in force (N/m) required for peeling a 1 m-wide conductor pattern from an insulating layer when the conductor pattern is pulled perpendicularly to be peeled from the insulating layer. The peel strength indicates that the adhesion strength between the conductor pattern and the insulating layer increases as the value of the force increases. An insulating resin adjusted so that the peel strength when the contact layer 41A is electrolessly plated is not lower than 850 N/m which is higher than the peel strength (e.g. 600 N/m to 700 N/m) when the first insulating layer 20 is electrolessly plated is further preferred as the material of the contact layer 41A. It is preferable that an insulating resin more excellent in chemical resistance (e.g. desmear resistance) than the insulating layer 40A is used as the material of the contact layer 41A. That is, it is preferable that an insulating resin hardly etched by a desmear processing liquid is used as the material of the contact layer 41A. It is preferable that an insulating resin adjusted so that the glass transition temperature Tg of the contact layer 41A is not lower than 150° C. is used as the material of the contact layer 41A. It is preferable that an insulating resin, for example, containing 30 vol % or more of an epoxy resin, and a relatively small amount (e.g. 1 vol % to 50 vol %, both inclusively) of an inorganic filler is used as a specific material of the contact layer 41A for achieving the aforementioned characteristic. It is more preferable that an insulating resin containing 30 vol % to 65 vol % (both inclusively) of an epoxy resin, and 1 vol % to 30 vol % (both inclusively) of an inorganic filler is used as a specific material of the contact layer 41A. Incidentally, the thermal expansion coefficient of the contact layer 41A takes a relatively high value of about 40 ppm/° C. to about 100 ppm/° C. because the inorganic filler content is relatively small as described above.

Moreover, the contact layer 41A is an insulating layer higher in surface smoothness than the insulating layer 40A. That is, the upper surface of the contact layer 41A (a surface opposite to a surface being in contact with the insulating layer 40A) is an even smooth surface (low roughness surface). Specifically, the upper surface of the contact layer 41A is a low roughness surface where shallow fine irregularities are formed. More specifically, the roughness of the upper surface of the contact layer 41A is set to be in a range of 50 nm to 350 nm in terms of surface roughness Ra value. The surface roughness Ra value mentioned herein is a kind of numerical value expressing surface roughness and is called arithmetic average roughness. Specifically, the surface roughness Ra value is calculated in such a manner that the absolute value of a height varying in a measurement region is measured from a surface as an average line and subjected to arithmetic averaging.

The fourth wiring layer 42 is formed on the contact layer 41A. The fourth wiring layer 42 has via-wirings 42a packed in via-holes VH3 which are formed through the third insulating layer 40 (the insulating layer 40A and the contact layer 41A) to expose the upper surface of the third wiring layer 31, and wiring patterns 42b formed on the contact layer 41A. The via-wirings 42a are electrically connected to the third wiring layer 31 exposed in the bottoms of the via-holes VH3. Incidentally, each of the via-holes VH3 and the via-wirings 42a is tapered to have a shape having its diameter increasing as the position goes from the lower side to the upper side in FIG. 1. For example, the thickness of the wiring patterns 42b of the fourth wiring layer 42 can be set to be in a range of about 20 μm to 35 μm.

The fourth insulating layer 50 is formed on the contact layer 41A so that the fourth wiring layer 42 is covered with the fourth insulating layer 50. For example, an insulating resin having the same composition as that of the first insulating layer 20 can be used as the material of the fourth insulating layer 50. For example, the thickness of the fourth insulating layer 50 can be set to be in a range of about 15 μm to about 35 μm.

The fifth wiring layer 51 is formed on the fourth insulating layer 50. The fifth wiring layer 51 has via-wirings 51a packed in via-holes VH4 which are formed through the fourth insulating layer 50 to expose the upper surface of the fourth wiring layer 42, and wiring patterns 51b formed on the fourth insulating layer 50. The via-wirings 51a are electrically connected to the fourth wiring layer 42 exposed in the bottoms of the via-holes VH4. Incidentally, each of the via-holes VH4 and the via-wirings 51a is tapered to have a shape having its diameter increasing as the position goes from the lower side to the upper side in FIG. 1. For example, the thickness of the wiring patterns 51b of the fifth wiring layer 51 can be set to be in a range of about 20 μm to about 35 μm.

The fifth insulating layer 60 is formed on the fourth insulating layer 50 so that the fifth wiring layer 51 is covered with the fifth insulating layer 60. For example, an insulating resin having the same composition as that of the first insulating layer 20 can be used as the material of the fifth insulating layer 60. For example, the thickness of the fifth insulating layer 60 can be set to be in a range of about 15 μm to about 35 μm.

The sixth wiring layer 61 is an uppermost (outermost) wiring layer formed on the fifth insulating layer 60. The sixth wiring layer 61 has via-wirings 61a packed in via-holes VH5 which are formed through the fifth insulating layer 60 to expose the upper surface of the fifth wiring layer 51, and wiring patterns 61b formed on the fifth insulating layer 60. The via-wirings 61a are electrically connected to the fifth wiring layer 51 exposed in the bottoms of the via-holes VH5. Incidentally, each of the via-holes VH5 and the via-wirings 61a is tapered to have a shape having its diameter increasing as the position goes from the lower side to the upper side in FIG. 1. For example, the thickness of the wiring patterns 61b of the sixth wiring layer 61 can be set to be in a range of about 20 μm to about 35 μm.

A solder resist layer 62 is formed on the outermost fifth insulating layer 60 on a side (upper side in FIG. 1) opposite to the surface where the electrode pads 11P are formed. For example, an epoxy-based insulating resin can be used as the material of the solder resist layer 62. For example, the thickness of the solder resist layer 62 can be set to be in a range of about 15 μm to about 35 μm.

Opening portions 62X for exposing parts of the wiring patterns 61b of the sixth wiring layer 61 as external connection pads 61P are formed in the solder resist layer 62. The external connection pads 61P are configured so that external connection terminals such as solder balls, lead pins, etc. which are used when the wiring board 1 is mounted in a mother board or the like can be connected to the external connection pads 61P. That is, in this embodiment, the surface where the external connection pads 61P are formed serves as an external connection terminal surface. Incidentally, if necessary, a metal layer may be formed on each of the wiring patterns 61b exposed out of the opening portions 62X so that each of the external connection terminals can be connected to the metal layer. An Au layer, an Ni/Au layer (a metal layer formed in such a manner that an Ni layer and an Au layer are formed in this order), an Ni/Pd/Au layer (a metal layer formed in such a manner that an Ni layer, a Pd layer and an Au layer are formed in this order), etc. can be listed as examples of the metal layer. Alternatively, the wiring patterns 61b exposed out of the opening portions 62X (or a metal layer when the metal layer is formed on the wiring patterns 61b) may be directly used as external connection terminals.

The planer shape of each of the opening portions 62X (external connection pads 61P) of the solder resist layer 62 is, for example, circular. For example, the diameter of each circle can be set to be in a range of about 200 μm to about 1000 μm. For example, the pitch of the external connection pads 61P can be set to be in a range of about 500 μm to about 1200 μm.

Structure of Semiconductor Package According to First Embodiment

The structure of a semiconductor package 2 using the wiring board 1 will be described below in accordance with FIG. 2. Incidentally, the wiring board 1 in FIG. 2 is drawn to be upside down, compared with that in FIG. 1.

As shown in FIG. 2, the semiconductor package 2 has a wiring board 1, a semiconductor chip 70 connected to the wiring board 1 by flip chip bonding, and an underfill resin 72. Solder 14 is formed on the electrode pads 11P of the wiring board 1. For example, eutectic solder or lead (Pb)-free solder (Sn—Ag-based, Sn—Cu-based, Sn—Ag—Cu-based, etc) can be used as the solder 14.

The semiconductor chip 70 has a circuit-forming surface (lower surface in FIG. 2) where bumps 71 are formed. The semiconductor chip 70 is electrically connected to the electrode pads 11P of the wiring board 1 through the bumps 71 and the solder 14.

The underfill resin 72 is provided so that a gap between the wiring board 1 and the semiconductor chip 70 is filled with the underfill resin 72. The underfill resin 72 is a resin for improving connection strength of connection portions between the bumps 71 and the electrode pads 11P and for suppressing occurrence of corrosion or electromigration of the electrode pads 11P to prevent reliability of the electrode pads 11P from being lowered. For example, an epoxy-based insulating resin can be used as the material of the underfill resin 72.

(Operation)

In the wiring board 1, the insulating layer 40A improved in mechanical strength by addition of a reinforcing material compared with the insulating layers 20, 30, 50 and 60 is provided so as to be located near the center in the direction of lamination of the wiring board 1 formed by lamination. As a result, the insulating layers 20 and 30 and the wiring layers 11, 21 and 31 provided under the reinforcing material-containing insulating layer 40A as the center are disposed so as to be substantially symmetrical with the insulating layers 50 and 60 and the wiring layers 42, 51 and 61 provided above the reinforcing material-containing insulating layer 40A as the center. Accordingly, vertical balance of the wiring board 1 with respect to the insulating layer 40A as the center becomes so good that occurrence of warping in the wiring board 1 can be suppressed.

Moreover, in the wiring board 1, the contact layer 41A is formed on the reinforcing material-containing insulating layer 40A, and the wiring patterns 42b are formed on the contact layer 41A. Here, the contact layer 41A is an insulating layer which has a low roughness surface as its upper surface (a surface where the wiring patterns 42b are formed) and which is higher in adhesion to a metal film (electroless plating) than the insulating layer 40A. For this reason, the wiring patterns 42b formed on the low roughness surface of the contact layer 41A can be provided as fine patterns.

Method of Manufacturing Wiring Board According to First Embodiment

A method of manufacturing the wiring board 1 will be described below.

Figure 3A:
FIGS. 3A to 3E are schematic sectional views showing a method of manufacturing the wiring board according to the first embodiment.

First, for production of the wiring board 1, a support board 80 is prepared as shown in FIG. 3A. For example, a metal plate or metal foil can be used as the support board 80. In this embodiment, for example, copper foil is used as the support board 80. For example, the thickness of the support board 80 is in a range of 35 μm to 100 μm.

Figure 3B:
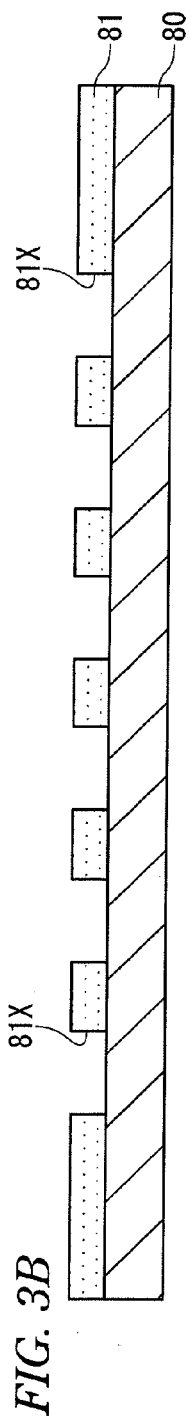

Then, in the step shown in FIG. 3B, a resist layer 81 having opening portions 81X is formed on one surface (upper surface in the drawing) of the support board 80. The opening portions 81X are formed so that portions of the upper surface of the support board 80 corresponding to regions where the first wiring layer 11 (see FIG. 1) will be formed are exposed. A photosensitive dry film or a liquid photo-resist (e.g. a liquid resist made of a novolac-based resin, an epoxy-based resin, or the like) or the like can be used as the material of the resist layer 81. For example, when a photosensitive dry film is used, the dry film is formed on the upper surface of the support board 80 by thermo-compression bonding and patterned by exposure and development to thereby form the resist layer 81 having opening portions 81X of predetermined patterns corresponding to the regions where the first wiring layer 11 will be formed. Incidentally, when a liquid photo-resist is used, the resist layer 81 can be also formed through the same step.

Figure 3C:
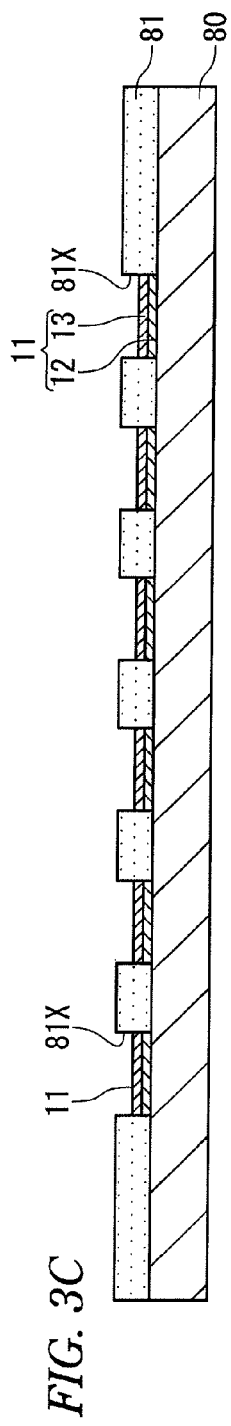

Successively, in the step shown in FIG. 3C, electrolytic plating using the support board 80 as a plating power feeding layer is applied to the upper surface of the support board 80 while the resist layer 81 is used as a plating mask. Specifically, by applying an electrolytic plating method to the upper surface of the support board 80 exposed out of the opening portions 81X of the resist layer 81, the first conductive layer 12 and the second conductive layer 13 are formed successively in the opening portions 81X to form the first wiring layer 11. For example, when the first conductive layer 12 has a structure in which an Au film, a Pd film and an Ni film are formed successively in this order, and the second conductive layer 13 is a Cu layer, the first conductive layer 12 is first formed in such a manner that the Au film, the Pd film and the Ni film are formed successively by an electrolytic plating method using the support board 80 as a plating power feeding layer. The second conductive layer 13 is then formed in such a manner that the Cu layer is formed on the first conductive layer 12 by an electrolytic plating method using the support board 80 as a plating power feeding layer.

Figure 3D:
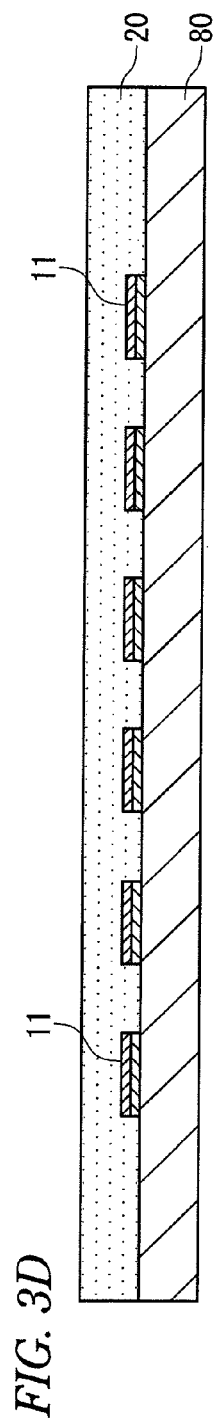

Then, in the step (insulating layer forming step) shown in FIG. 3D, the resist layer 81 shown in FIG. 3C is removed and the first insulating layer 20 is formed on the upper surface of the support board 80 so that the first wiring layer 11 is covered with the first insulating layer 20. Incidentally, for example, the first insulating layer 20 can be formed in such a manner that a resin film is formed on the support board 80 and then the resin film is heated at a temperature of about 130 to 150° C. while pressed so as to be hardened.

Figure 3E:
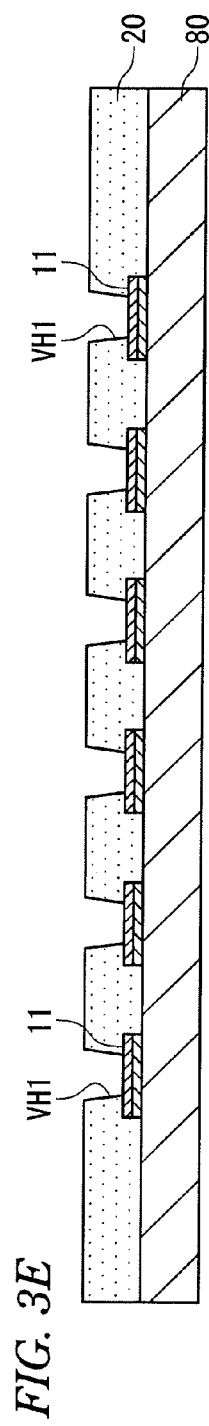

Successively, in the step shown in FIG. 3E, the via-holes VH1 are formed in predetermined places of the first insulating layer 20 so that the upper surface of the first wiring layer 11 is exposed. For example, the via-holes VH1 can be formed by a laser machining method using a carbon dioxide laser, a UV-YAG laser or the like. Incidentally, for example, when the first insulating layer 20 is made of a photosensitive resin, the required via-holes VH1 may be formed by photolithography.

When the via-holes VH1 are formed by a laser machining method, desmear processing is then performed to remove a resin residue (resin smear) of the first insulating layer 20 deposited on the upper surface of the first wiring layer 11 exposed in the bottoms of the via-holes VH1.

Then, in the step (wiring layer forming step) shown in FIG. 4A, the via-holes VH1 of the first insulating layer 20 are filled with a via-conductor so that via-wirings 21a are formed and wiring patterns 21b electrically connected to the first wiring layer 11 through the via-wirings 21a are formed on the first insulating layer 20. These via-wirings 21a and wiring patterns 21b, that is, the second wiring layer 21 can be formed by one of various wiring forming methods such as a semi-additive method, a subtractive method, etc.

Then, in the step shown in FIG. 4B, the steps shown in FIGS. 3D to 4A are repeated to laminate the second insulating layer 30 and the third wiring layer 31. That is, as shown in FIG. 4B, the second insulating layer 30 is formed on the first insulating layer 20 and the second wiring layer 21, and the via-holes VH2 reaching the upper surfaces of the wiring patterns 21b are formed in the second insulating layer 30. Then, via-wirings 31a are formed in the via-holes VH2, and wiring patterns 31b electrically connected to the via-wirings 31a are formed.

Successively, in the step shown in FIG. 4C, an insulating layer 40B serving as an insulating layer 40A (see FIG. 1) is prepared, that is, a reinforcing material-containing insulating layer 40B made of woven or unwoven fabric of glass, aramid or LCP (Liquid Crystal Polymer) fiber impregnated with an unhardened thermosetting resin is prepared. A B-stage (semi-hardened state) layer is used as the insulating layer 40B. For example, the thickness of the insulating layer 40B can be set to be in a range of 30 μm to 80 μm.

In the step shown in FIG. 4C, a structure 82A in which an insulating layer 41B serving as a contact layer 41A (see FIG. 1) is bonded to a carrier 82 is prepared. An insulating resin containing 30 vol % or more of an unhardened epoxy resin, and 1 to 50 vol % of an inorganic filler can be used as the material of the insulating layer 41B. A semi-hardened state layer is used as the insulating layer 41B. For example, the thickness of the insulating layer 41B can be set to be in a range of about 1 μm to about 4 μm. For example, copper foil can be used as the carrier 82 for carrying the insulating layer 41B. For example, the thickness of the carrier 82 can be set to be in a range of about 2 μm to about 18 μm.

In the step (first process) shown in FIG. 4C, the insulating layer 40B and the structure 82A are disposed sequentially from bottom on the upper surface side of the structure shown in FIG. 4B. On this occasion, the structure 82A is disposed in a state where the insulating layer 41B faces downward so that the insulating layer 41B faces the insulating layer 40B. Then, the structure shown in FIG. 4B, the insulating layer 40B and the structure 82A are pressed while heated at a temperature of about 190° C. to about 250° C. in a vacuum atmosphere from both sides. Consequently, as shown in FIG. 5A, the insulating layers 40B and 41B are hardened so that the insulating layer 40A and the contact layer 41A are formed on the second insulating layer 30 and the third wiring layer 31. Moreover, as the insulating layers 40B and 41B are hardened, the second insulating layer 30 and the third wiring layer 31 are bonded to the insulating layer 40A while the insulating layer 40A is bonded to the contact layer 41A. Consequently, the third insulating layer 40 in which the insulating layer 40A and the contact layer 41A are formed in this order is formed on the second insulating layer 30 and the third wiring layer 31.

Incidentally, for example, when the thickness of the insulating layer 40B before lamination is 60 μm and the thickness of the wiring patterns 31b is 35 μm, the thickness of the insulating layer 40A after lamination is about 40 μm.

Successively, in the step shown in FIG. 5B, the carrier 82 (copper foil) shown in FIG. 5A is selectively removed from the contact layer 41A. For example, wet etching using an aqueous solution of ferric chloride, an aqueous solution of cupric chloride, an aqueous solution of ammonium persulfate or the like can be used for selectively removing the carrier 82 (copper foil) from the contact layer 41A.

Then, in the step shown in FIG. 5C, via-holes VH3 are formed in predetermined places of the insulating layer 40A and the contact layer 41A so that the upper surfaces of the wiring patterns 31b of the third wiring layer 31 are exposed. For example, the via-holes VH3 can be formed by a laser machining method using a carbon dioxide laser, a UV-YAG laser or the like. Incidentally, the via-holes VH3 formed by a laser machining method are provided as concave portions each shaped like a frustum of a circular cone which has an opening portion on a side where the fourth insulating layer 50 (see FIG. 1) will be formed, and a bottom formed by the upper surface of the third wiring layer 31 so that the area of the opening portion is larger than the area of the bottom.

When the via-holes VH3 are formed by a laser machining method, desmear processing is then performed to remove a resin residue of the insulating layer 40A and the contact layer 41A deposited on the upper surface of the third wiring layer 31 exposed in the bottoms of the via-holes VH3. For example, this desmear processing can be performed by a permanganate method or the like. In this desmear processing, a desmear liquid (etchant) is also fed to the surface of the contact layer 41A, so that the surface of the contact layer 41A is etched with the desmear liquid, and the surface of the contact layer 41A is roughened. However, on this occasion, the contact layer 41A is less subject to the desmear processing, that is, the contact layer 41A is excellent in desmear resistance because the thermosetting resin (epoxy-based resin in the contact layer 41A) content is high to be not lower than 30 vol % and the inorganic filler content is relatively low to be in the range of 1-50 vol %, compared with the insulating layer 40A. For this reason, the contact layer 41A is hardly etched with the desmear liquid so that the surface of the contact layer 41A is kept as low roughness after the desmear processing. Specifically, the roughness of the surface of the contact layer 41A after the desmear processing is kept at a low value of about 50-350 nm in terms of surface roughness Ra value. In other words, the composition (e.g. epoxy-based resin content and inorganic filler content) of the contact layer 41A is adjusted to obtain such desmear resistance that the roughness of the surface of the contact layer 41A after the desmear processing can be kept at a low value of about 50-350 nm in terms of surface roughness Ra value even when the desmear processing is performed.

Then, in the step shown in FIG. 6A, a seed layer 83 of copper or the like is formed on the upper surfaces of the wiring patterns 31b exposed in the bottoms of the via-holes VH3, the inner wall surfaces of the via holes VH3 and the upper surface of the contact layer 41A. For example, the seed layer 83 is formed by an electroless copper plating method or a sputtering method. On this occasion, the inorganic filler content of the contact layer 41A causing lowering of adhesion to the seed layer 83 (e.g. electroless copper plating) is so relatively low that the seed layer 83 adheres to the contact layer 41A well. Specifically, the inorganic filler content of the contact layer 41A is equal to or lower than the inorganic filler content of an interlayer insulating layer (the first insulating layer 20 or the like) containing no reinforcing material. For this reason, the adhesion strength between the contact layer 41A and the seed layer 83 is equal to or higher than the adhesion strength between the first insulating layer 20 and the seed layer. Moreover, because the roughness of the upper surface of the contact layer 41A is low as described above, the fourth wiring layer 42 formed on the contact layer 41A can be provided as a fine line structure.

Successively, in the step shown in FIG. 6B, a dry film resist (DFR) or the like having opening portions 84X corresponding to the patterns of the fourth wiring layer 42 is used for forming a resist layer 84 on the seed layer 83. For example, this resist layer 84 is formed by photolithography.

Then, in the step shown in FIG. 6C, the opening portions 84X of the resist layer 84 containing the via-holes VH3 are filled with a metal plating layer 42C of copper or the like by an electrolytic plating method using the seed layer 83 as a power feeding layer. In the via-holes VH3, plating is performed on the inside from the seed layer 83, so that the via-holes VH3 are filled with a via-conductor 42D. Consequently, via-wirings 42a constituted by the seed layer 83 and the via-conductor 42D are formed, and wiring patterns 42b constituted by the seed layer 83 and the metal plating layer 42C are formed. On this occasion, the wiring patterns 42b are formed on the contact layer 41A of the low roughness surface as described above, so that the wiring patterns 42b can be provided as a fine line structure.

Figure 7A:
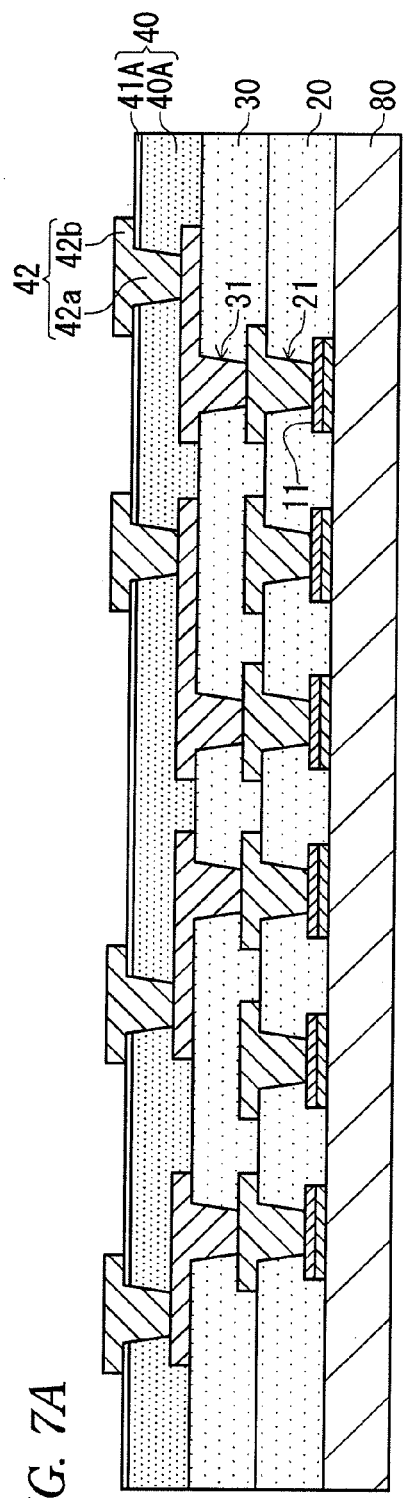
FIGS. 7A and 7B are schematic sectional views showing the method of manufacturing the wiring board according to the first embodiment.

Then, in the step shown in FIG. 7A, the resist layer 84 shown in FIG. 6C is removed and then the unnecessary seed layer 83 is removed by etching while the metal plating layer 42C and the via-conductor 42D are used as a mask. By the steps (second process) shown in FIGS. 6A to 7A, the fourth wiring layer 42 having the via-wirings 42a and the wiring patterns 42b is formed on the insulating layer 40A and the contact layer 41A. That is, the fourth wiring layer 42 is formed by a semi-additive method.

Figure 7B:
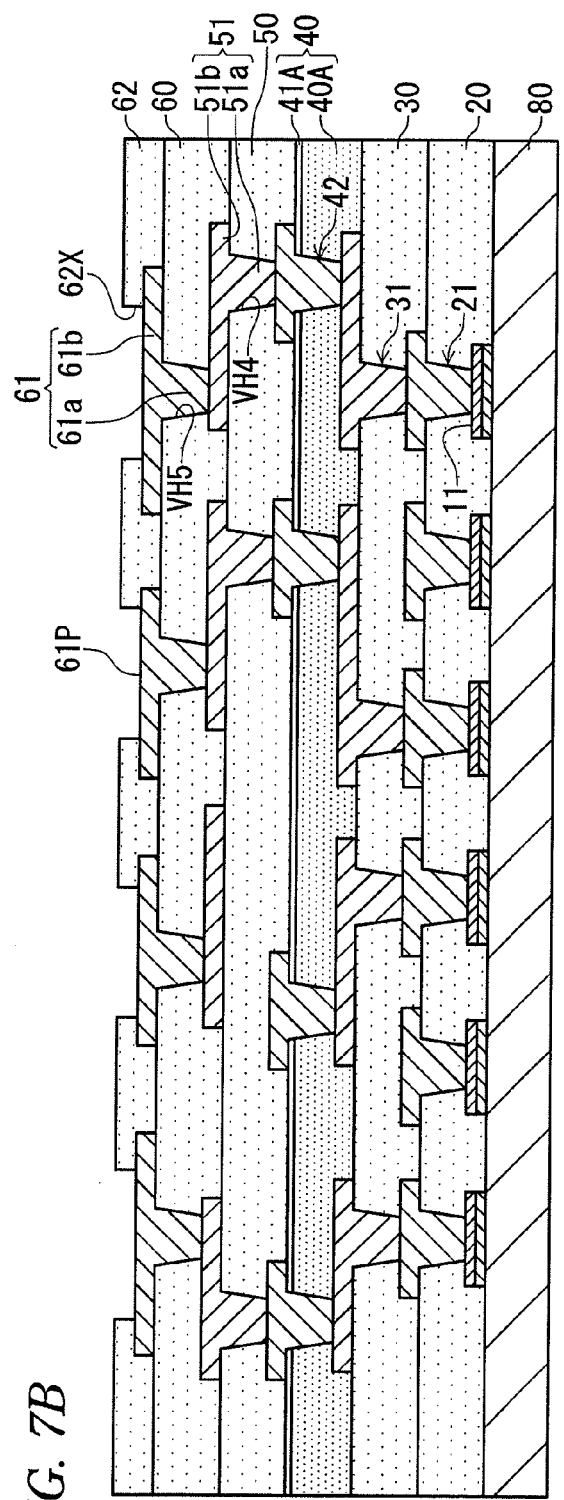

Then, in the step shown in FIG. 7B, the steps shown in FIGS. 3D to 4A are repeated again to laminate insulating layers and wiring layers alternately. That is, as shown in FIG. 7B, a fourth insulating layer 50 is formed on the contact layer 41A and the fourth wiring layer 42, and via-holes VH4 reaching the upper surface of the fourth wiring layer 42 are formed in the fourth insulating layer 50. Then, via-wirings 51a are formed in the via-holes VH4, and wiring patterns 51b electrically connected to the via-wirings 51a are formed to thereby provide a fifth wiring layer 51. Then, a fifth insulating layer 60 is formed on the fourth insulating layer 50 and the fifth wiring layer 51, and via-holes VH5 reaching the upper surfaces of the wiring patterns 51b are formed in the fifth insulating layer 60. Then, via-wirings 61a are formed in the via-holes VH5, and wiring patterns 61b electrically connected to the via-wirings 61a are formed to thereby provide a sixth wiring layer 61.

Then, in the step shown in FIG. 7B, a solder resist layer 62 having opening portions 62X for exposing external connection pads 61P set in required places of the sixth wiring layer 61 is formed on the fifth insulating layer 60 and the sixth wiring layer 61. For example, this solder resist layer 62 can be formed in such a manner that a photosensitive solder resist film is formed or a liquid solder resist is applied so that the resist is patterned into a required shape. Consequently, parts of the sixth wiring layer 61 are exposed as external connection pads 61P out of the opening portions 62X of the solder resist layer 62. Incidentally, if necessary, a metal layer, for example, obtained by laminating an Ni layer and an Au layer in this order may be formed on the external connection pads 61P. For example, this metal layer can be formed by an electroless plating method.

Then, in the step shown in FIG. 8A, the support board 80 (see FIG. 7B) used as a temporary board is removed. For example, when copper foil is used as the support board 80, the support board 80 can be removed by wet etching using an aqueous solution of ferric chloride, an aqueous solution of cupric chloride, an aqueous solution of ammonium persulfate or the like. On this occasion, the outermost layer of the first wiring layer 11 exposed out of the first insulating layer 20 is an Au film or the like, so that only the support board 80 provided as copper foil can be etched selectively. However, when the sixth wiring layer 61 is a copper layer, it is necessary to perform the aforementioned wet etching while using the sixth wiring layer 61 as a mask in order to prevent the sixth wiring layer 61 exposed in the bottoms of the opening portions 62X from being etched together with the support board 80.

By the aforementioned producing process, the wiring board 1 according to this embodiment can be produced.

Method of Manufacturing Semiconductor Package According to First Embodiment

A method of manufacturing a semiconductor package 2 using the wiring board 1 produced as described above will be described below.

First, in the step shown in FIG. 8B, solder 14 is formed on the electrode pads 11P of the wiring board 1. For example, the solder 14 can be formed by applying solder paste or mounting solder balls. Successively, in the step shown in FIG. 9A, a semiconductor chip 70 having terminals on which bumps 71 are formed is positioned on the electrode pads 11P, and the solder 14 and the bumps 71 are melted so that the semiconductor chip 70 is electrically connected to the electrode pads 11P (flip chip bonding). In the step shown in FIG. 9B, a gap between the semiconductor chip 70 and the first insulating layer 20 of the wiring board 1 is filled with a liquid underfill resin 72, and the liquid underfill resin 72 is hardened. By the aforementioned manufacturing steps, the semiconductor package 2 according to this embodiment can be manufactured.

According to the embodiment as described above, the following effects can be obtained.

(1) In the configuration of the wiring board 1, the contact layer 41A is formed on the reinforcing material-containing insulating layer 40A and the wiring patterns 42b are formed on the contact layer 41A. Here, the contact layer 41A is an insulating layer which has an upper surface (a surface where the wiring patterns 42b are formed) provided as a low roughness surface and which is higher in adhesion to a metal film (electroless plating) than the insulating layer 40A. For this reason, the wiring patterns 42b formed on the low roughness surface of the contact layer 41A can be provided as fine patterns. Specifically, the wiring patterns 42b can be formed finely up to about L/S=8 μm/8 μm.

(2) The wiring patterns 42b are formed on the contact layer 41A which is more excellent in desmear resistance than the reinforcing material-containing insulating layer 40A. Here, the surface roughness of the upper surface of the contact layer 41A after desmear processing is kept at a low value of 50 to 350 nm in terms of surface roughness Ra value. For this reason, when the wiring patterns 42b are formed on such an upper surface (low roughness surface) of the contact layer 41A, a semi-additive method can be used for forming fine wiring.

(3) In the producing method according to this embodiment, the wiring layers 11, 21 and 31 and the insulating layers 20 and 30 are supported by the support board 80 when the wiring layers 11, 21 and 31 and the insulating layers 20 and 30 are formed. Accordingly, occurrence of warping can be suppressed favorably. Moreover, because the wiring layers 11, 21 and 31 and the insulating layers 20 and 30 are formed while supported by the support board 80 having high rigidity, the problem of thin board conveyance which may occur at the time of production of the wiring board can be prevented from occurring.

After the second insulating layer 30 and the third wiring layer 31 are formed, the third insulating layer 40 containing the insulating layer 40A high in mechanical strength is formed by lamination. The wiring layers 42, 51 and 61 and the insulating layers 50 and 60 are formed on the third insulating layer 40 containing the insulating layer 40A high in mechanical strength. For this reason, the wiring layers 42, 51 and 61 and the insulating layers 50 and 60 are supported by the third insulating layer 40 and the support board 80, so that occurrence of warping can be suppressed favorably even when the wiring layers 42, 51 and 61 and the insulating layers 50 and 60 are formed.

(4) Because the wiring board 1 can be produced without largely altering the multilayer wiring board producing process heretofore performed, reduction in equipment cost can be attained. Thus, reduction in production cost of the wiring board 1 can be attained.

(5) In the wiring board 1, the insulating layer 40A more improved in mechanical strength than the insulating layers 20, 30, 50 and 60 by addition of a reinforcing material is provided so as to be located near the center in the direction of lamination of the wiring board 1 formed by lamination. Consequently, the insulating layers 20 and 30 and the wiring layers 11, 21 and 31 provided in the lower portion with respect to the reinforcing material-containing insulating layer 40A provided as the center are disposed so as to be substantially symmetrical with the insulating layers 50 and 60 and the wiring layers 42, 51 and 61 provided in the upper portion with respect to the reinforcing material-containing insulating layer 40A provided as the center. Accordingly, vertical balance with respect to the insulating layer 40A of the wiring board 1 as the center becomes so good that occurrence of warping in the wiring board 1 can be suppressed. Incidentally, when warping occurs in the wiring board 1 because of a difference in thermal expansion coefficient between an insulating layer made of a resin and a wiring layer made of a metal, the semiconductor chip 70 cannot be mounted on the wiring board 1 appropriately so that mounting reliability is lowered. On the contrary, according to this embodiment, occurrence of warping can be suppressed as described above. Accordingly, the semiconductor chip 70 can be mounted on the wiring board 1 appropriately so that mounting reliability can be improved.

Incidentally, the first embodiment can be carried out in the following forms which have been changed properly.

Modifications of First Embodiment

In the first embodiment, the insulating layer 40 having the reinforcing material-containing insulating layer 40A and the contact layer 41A having low roughness and improved in adhesion to electroless plating is provided near the center in the direction of lamination. The invention is not limited thereto as long as at least one of interlayer insulating layers formed in the wiring board is the insulating layer 40 having the insulating layer 40A and the contact layer 41A. Accordingly, the position where the insulating layer 40 is formed and the number of such insulating layers 40 are not particularly limited.

Figure 10A:
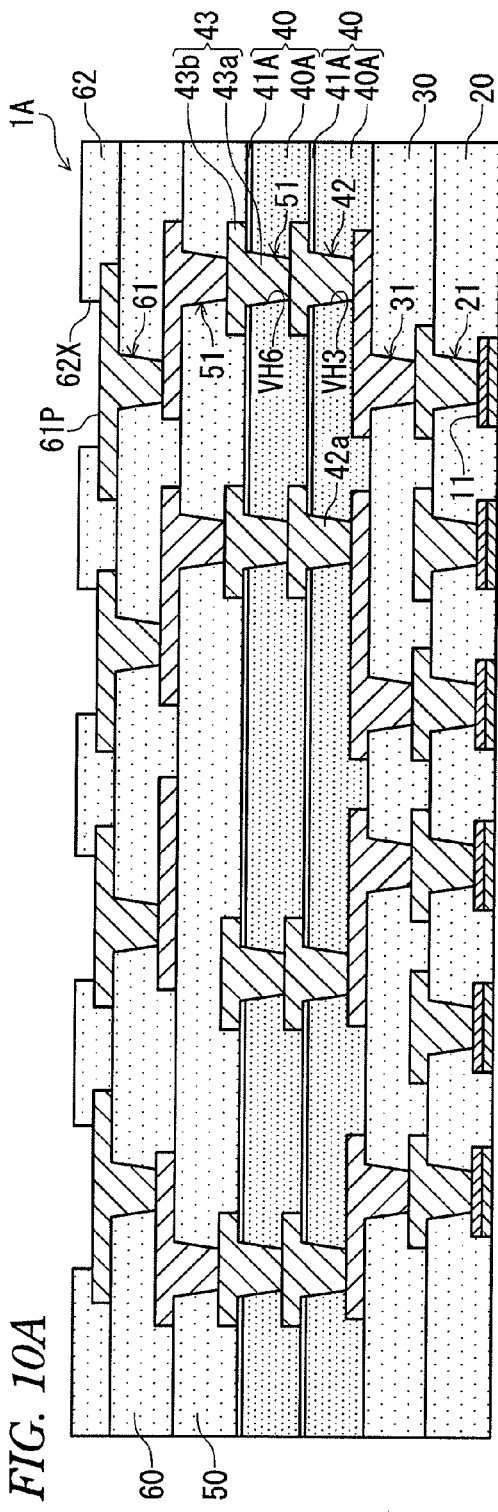
FIGS. 10A and 10B are schematic sectional views showing a wiring board according to a modification of the first embodiment.

For example, as shown in FIG. 10A, a plurality of insulating layers 40 (two in this modification) each having a reinforcing material-containing insulating layer 40A and a contact layer 41A may be provided near the center in the direction of lamination. That is, a wiring board 1A having the two insulating layers 40 is configured so that an insulating layer 40 (upper insulating layer 40) and a wiring layer 43 formed on the insulating layer 40 are added to the wiring board 1 shown in FIG. 1. The wiring layer 43 has via-wirings 43a packed in via-holes VH6 which are formed through the reinforcing material-containing insulating layer 40A and the contact layer 41A to expose the upper surface of the wiring layer 42, and wiring patterns 43b formed on the contact layer 41A. By this structure, the rigidity of the wiring board 1A can be more improved in the vicinity of the center in the direction of lamination. Consequently, the reinforcing effect based on the insulating layers 40 can be improved so that warping of the wiring board 1A can be reduced effectively. In other words, the plurality of insulating layers 40 exhibit the same effect as in a core board (support member) having high rigidity.

In a wiring board configured so that a build-up wiring layer and an insulating layer are formed on each of upper and lower surfaces of a core board, it is necessary to form through-holes in the core board. There is however a problem that increases in total density of the wiring board cannot be attained because it is difficult to form the through-holes finely. Moreover, there is another problem that it is difficult to form through-hole plating voidlessly when plating is applied to the through-holes.

On the contrary, in accordance with the structure shown in FIG. 10A, the wiring layers 42 and 43 formed on the plurality of insulating layers 40 are interlayer-connected through via-wirings 42a and 43a packed in the via-holes VH3 and VH6 formed in the insulating layers 40 respectively. It is easy to form such via-wirings 42a and 43a finely and voidlessly. For this reason, increase in total density of the wiring board can be achieved so that reliability of interlayer connection of the wiring layers can be improved.

Figure 10B:
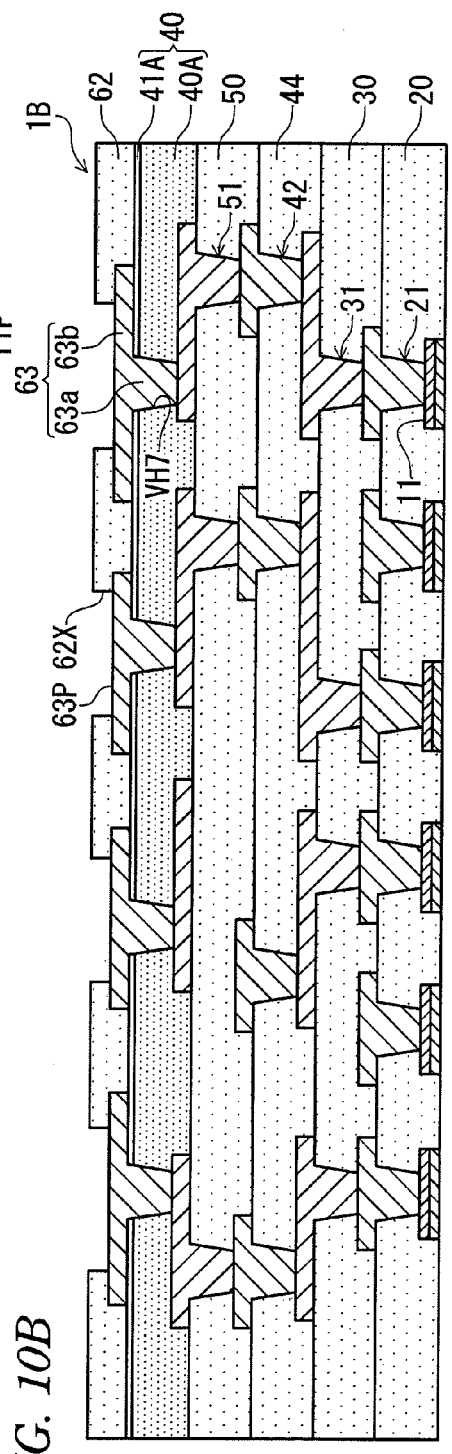

For example, as shown in FIG. 10B, the interlayer insulating layer which is the outermost layer on the external connection terminal surface side may be replaced by an insulating layer 40 having a reinforcing material-containing insulating layer 40A and a contact layer 41A. That is, in a wiring board 1B, the fifth insulating layer 60 in the wiring board 1 in FIG. 1 is replaced by an insulating layer 40, and the insulating layer 40 in the wiring board 1 is replaced by an insulating layer 44 containing no reinforcing material. In the wiring board 1B, a wiring layer 63 formed on the insulating layer 40 has via-wirings 63a packed in via-holes VH7 which are formed through the reinforcing material-containing insulating layer 40A and the contact layer 41A to expose the upper surface of the wiring layer 51, and wiring patterns 63b formed on the contact layer 41A. Incidentally, the wiring layer 63 exposed out of the opening portions 62X of the solder resist layer 62 serves as external connection pads 63P. In this manner, the insulating layer 40 having the reinforcing material-containing insulating layer 40A and the contact layer 41A may be provided so as to be biased toward the external connection terminal surface side. Though not shown, the insulating layer 40 having the reinforcing material-containing insulating layer 40A and the contact layer 41A may be provided so as to be biased toward the chip mounting surface side.

Figure 11:
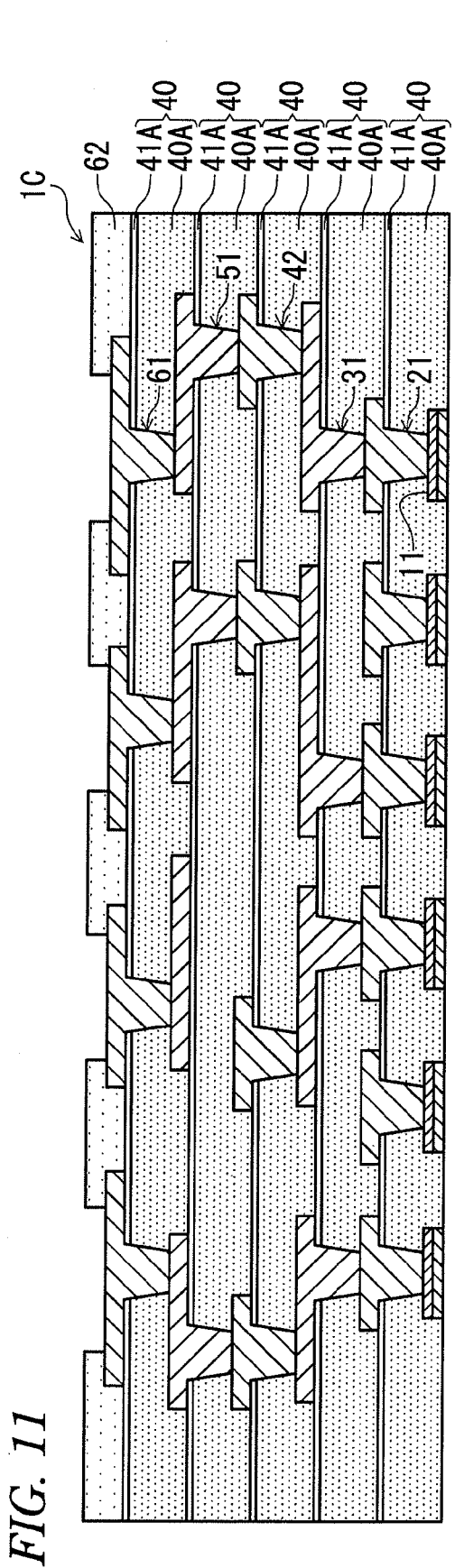
FIG. 11 is a schematic sectional view showing a wiring board according to a modification of the first embodiment.

For example, as shown in FIG. 11, all interlayer insulating layers may be replaced by insulating layers 40 each having a reinforcing material-containing insulating layer 40A and a contact layer 41A. That is, in a wiring board 1C, all the insulating layers 20, 30, 50 and 60 in the wiring board 1 shown in FIG. 1 are replaced by the insulating layers 40. In this case, warping of the wiring board 1C can be reduced effectively. For example, when there is the possibility that warping of the wiring board 1C will become intensive in consideration of stress of materials, etc. used in the wiring board 1C, the number of built-up layers, the thickness of each layer, etc., it is preferable that all the interlayer insulating layers are replaced by the insulating layers 40 each having the reinforcing material-containing insulating layer 40A and the contact layer 41A as described in this modification.

As described above, in the wiring board 1 according to the first embodiment, any one of the interlayer insulating layers to be formed may be replaced by the insulating layer 40 having the insulating layer 40A and the contact layer 41A. In other words, in accordance with the method of manufacturing the wiring board 1 according to the first embodiment, any insulating layer can be replaced by the insulating layer 40. That is, any insulating layer can be replaced by the insulating layer 40 suitably in accordance with characteristic (the number of built-up layers, the thickness of each layer, the area occupied by each wiring layer, etc.) of the wiring board.

EXAMPLES

The first embodiment and its modifications will be described below more specifically in connection with examples and comparative examples.

Here is described a result of verification as to whether a contact layer 41A exerts a bad influence on improvement in warping of the wiring board or not, when the contact layer 41A is added. That is, the inorganic filler content of the contact layer 41A is so relatively small that the thermal expansion coefficient of the contact layer 41A becomes higher (e.g. about 40-100 ppm/° C.) than those of the other insulating layers 20, 30, 40A, etc. The thermal expansion coefficient of the contact layer 41A is largely different from the thermal expansion coefficient (e.g. about 17 ppm/° C.) of a wiring layer (copper). For this reason, there is the possibility that warping may occur in the wiring board 1 because of the difference between the thermal expansion coefficients. That is, warping of the wiring board is improved by addition of the reinforcing material-containing insulating layer 40A and the fine structure of wiring patterns is achieved by formation of the contact layer 41A but there is the possibility that addition of the contact layer 41A will exert a bad influence on improvement in warping due to the insulating layer 40A. Therefore, as shown in FIGS. 12A and 13, simulation of warping is applied on each of wiring boards (Examples 1 to 3) in which at least one insulating layer 40 having an insulating layer 40A and a contact layer 41A is provided, wiring boards (Comparative Examples 1 to 3) in which only an insulating layer 40A is provided in place of each insulating layer 40 and a wiring board (Comparative Example 4) in which the insulating layer 40A and the contact layer 41A are not provided.

Example 1

As shown in FIG. 12A, the wiring board according to Example 1 is formed in such a manner that seven wiring layers C1 to C7 and six insulating layers A1 to A6 are formed alternately and a solder resist layer SR is formed on the lowermost insulating layer A6. The wiring board is formed by successively laminating the chip mounting surface side wiring layers C1 to C7 and insulating layers A1 to A6 on the support board in the same manner as in the method of manufacturing the wiring board 1 according to the first embodiment. Here, the insulating layer A4 is an insulating layer 40 which is a laminate of a reinforcing material-containing insulating layer 40A and a contact layer 41A, and the other insulating layers A1 to A3, A5 and A6 are insulating layers containing no reinforcing material.

As a condition for simulation, the thermal expansion coefficient and Young's modulus of the insulating layer 40A are adjusted to 16.5 ppm/° C. and about 30000 MPa respectively and the thermal expansion coefficient and Young's modulus of the contact layer 41A are adjusted to 70-90 ppm/° C. and about 2000 MPa respectively to thereby adjust the thermal expansion coefficient and Young's modulus of the insulating layer 40 to 17.0 ppm/° C. and about 29000 MPa respectively. On the other hand, the thermal expansion coefficient and Young's modulus of the insulating layer containing no reinforcing material are adjusted to 39 ppm/° C. and about 5000 MPa respectively, and the thermal expansion coefficient and Young's modulus of the solder resist layer SR are adjusted to 40 ppm/° C. and about 3800 MPa respectively.

The planer shape of the wiring board is provided as a rectangular shape of 45 mm×45 mm. Specifically, as shown in FIG. 12B, the layer thicknesses of the wiring layers C1 to C7 are set to be 15 μm, the layer thickness of the insulating layer A1 is set to be 15 μm, the layer thicknesses of the insulating layers A2, A3, A5 and A6 containing no reinforcing material are set to be 30 μm, the layer thickness of the reinforcing material-containing wiring layer A4 is set to be 40 μm, and the layer thickness of the solder resist layer SR is set to be 15 μm. Here, the layer thickness (40 μm) of the insulating layer A4 which is the insulating layer 40 is the sum of the thickness (38 μm) of the insulating layer 40A and the thickness (2 μm) of the contact layer 41A. The Cu areas of the wiring layers C1 to C7 are adjusted so that the remaining copper ratios of the wiring layers C1 to C7 are 1.5%, 66.8%, 88.6%, 62.3%, 82.5%, 76.1% and 82.2% respectively. Here, the remaining copper ratio is a ratio of the area of a copper layer for forming a wiring layer to the area on an insulating layer.

Incidentally, the aforementioned simulation condition is also applied to other Examples 2 and 3 and Comparative Examples 1 to 4.

Example 2

As shown in FIG. 13A, the wiring board according to Example 2 is formed so that the insulating layers A3 and A5 are provided as the insulating layers 40 in addition to the insulating layer A4 provided as the insulating layer 40.

Example 3

As shown in FIG. 13B, the wiring board according to Example 3 is formed so that all the insulating layers A1 to A6 are provided as the insulating layers 40.

Comparative Example 1

As shown in FIG. 13C, the wiring board according to Comparative Example 1 is formed so that the contact layer 41A is removed from the insulating layer A4 of the wiring board according to Example 1 and the insulating layer 40 of the wiring board according to Example 1 is replaced by the reinforcing material-containing insulating layer 40A singly.

Comparative Example 2

As shown in FIG. 13D, the wiring board according to Comparative Example 2 is formed so that the contact layers 41A are removed from the insulating layers A3 to A5 of the wiring board according to Example 2 and the insulating layers 40 of the wiring board according to Example 2 are replaced by the reinforcing material-containing insulating layers 40A singly and respectively.

Comparative Example 3

As shown in FIG. 13E, the wiring board according to Comparative Example 3 is formed so that the contact layers 41A are removed from the insulating layers A1 to A6 of the wiring board according to Example 3 and the insulating layers 40 of the wiring board according to Example 3 are replaced by the reinforcing material-containing insulating layers 40A singly and respectively.

Comparative Example 4

As shown in FIG. 13F, the wiring board according to Comparative Example 4 is formed so that all the insulating layers A1 to A6 are provided as insulating layers containing no reinforcing material. In this case, the thickness of the insulating layer A1 is set to be 15 μm, and the thicknesses of the other insulating layers A2 to A6 are set to be 30 μm.

(Measuring Method)

Warping is measured when the temperature is reduced to 25 degrees after stress is released in the condition that the wiring board according to each example is put under an environment of 190 degrees. As shown in FIG. 12C, warping is measured as a difference in height between respective end portions in a half diagonal length of the wiring board, that is, between a board center portion B1 and a corner portion B2. Incidentally, simulation results are shown in Table 1 while the amount of warping in the case where the chip mounting surface is convexly warped is regarded as plus and the amount of warping in the case where the chip mounting surface is concavely warped is regarded as minus.

TABLE 1

| | Position of Insulating Layer 40 | Position of Insulating Layer 40A | Amount of Warping [μm] |
|---|---|---|---|
| Example 1 | A4 | — | −643 |
| Example 2 | A3 to A5 | — | −561 |
| Example 3 | A1 to A6 | — | −89 |
| Comparative Example 1 | — | A4 | −640 |
| Comparative Example 2 | — | A3 to A5 | −552 |
| Comparative Example 3 | — | A1 to A6 | −36 |
| Comparative Example 4 | None | None | −671 |

(Simulation Results)

As shown in Table 1, first, in the wiring board according to Comparative Example 4 in which all the insulating layers A1 to A6 are insulating layers containing no reinforcing material, the amount of warping is −671 μm. On the contrary, in the wiring boards according to Examples 1 to 3 in which at least one of the insulating layers A1 to A6 is provided as the insulating layer 40 (composed of a reinforcing material-containing insulating layer 40A and a contact layer 41A), the amounts of warping are −643 μm, −561 μm and −89 μm, respectively. It is found that the amount of warping in each of Examples 1 to 3 is smaller than the amount of warping in Comparative Example 4. As described above, there is the possibility that the provision of the contact layer 41A having a high thermal expansion coefficient will exert a bad influence on the warping improvement effect. It is however obvious from the simulation results that warping of the wiring board can be improved sufficiently even when the contact layer 41A is provided. In comparison between Example 1 and Comparative Example 1 and between Example 2 and Comparative Example 2, the amounts of warping in Examples 1 and 2 are substantially equal to the amounts of warping in the case where there is no contact layer 41A (Comparative Examples 1 and 2). From this fact, it is found that the contact layer 41A does not exert a bad influence on improvement in warping of the wiring board due to the insulating layer 40A even when the contact layer 41A having a thermal expansion coefficient largely different from the thermal expansion coefficient of the wiring layer is added. This reason is considered. In Examples 1 and 2, the thickness of the contact layer 41A is adjusted to about 5.3% of the thickness of the insulating layer 40A, and the Young's modulus of the contact layer 41A is adjusted to about 6.7% of the Young's modulus of the insulating layer 40A. In this manner, the contact layer 41A is sufficiently thinner than the insulating layer 40A and the Young's modulus of the contact layer 41A is smaller than that of the insulating layer 40A. Accordingly, it is thought of that a function of weakening the warping improvement effect due to the reinforcing material-containing insulating layer 40A is so small that the contact layer 41A does not exert a bad influence on the warping improvement.

In Example 3 in which all the insulating layers A1 to A6 are provided as the insulating layers 40 (each composed of a reinforcing material-containing insulating layer 40A and a contact layer 41A), it is found that a high warping improvement effect is obtained because the amount of warping is −89 μm. However, in comparison between Example 3 and Comparative Example 3, the absolute value of the amount of warping in Example 3 is 50 μm or more larger than that in Comparative Example 3. It is thought of that this is because the influence of the thermal expansion coefficient (or Young's modulus) of the contact layer 41 on the amount of warping increases as the absolute value of the amount of warping decreases. In accordance with this, it is thought of that the difference in the amount of warping increases in accordance with the presence/absence of the contact layer 41A. However, the difference in the amount of warping is a difference generated when the absolute value of the amount of warping becomes sufficiently small. Accordingly, as is obvious from the simulation results, it can be said that the warping improvement effect due to the insulating layer 40 having the contact layer 41A is obtained sufficiently even when the difference in the amount of warping between Example 3 and Comparative Example 3 increases.

Second Embodiment

A second embodiment will be described below with reference to FIGS. 14, 15A-15C and 16A-16C.

The first embodiment has been described about a wiring board formed by alternately laminating wiring layers and insulating layers from the chip mounting surface side. On the contrary, this embodiment will be described about a wiring board formed by alternately laminating wiring layers and insulating layers from the external connection terminal surface side. Although the first embodiment is configured so that an insulating layer having a reinforcing material-containing insulating layer and a contact layer is provided near the center in the direction of lamination, this embodiment is configured so that an insulating layer having a reinforcing material-containing insulating layer and a contact layer is provided as the outermost layer on the external connection terminal surface side.

Figure 14:
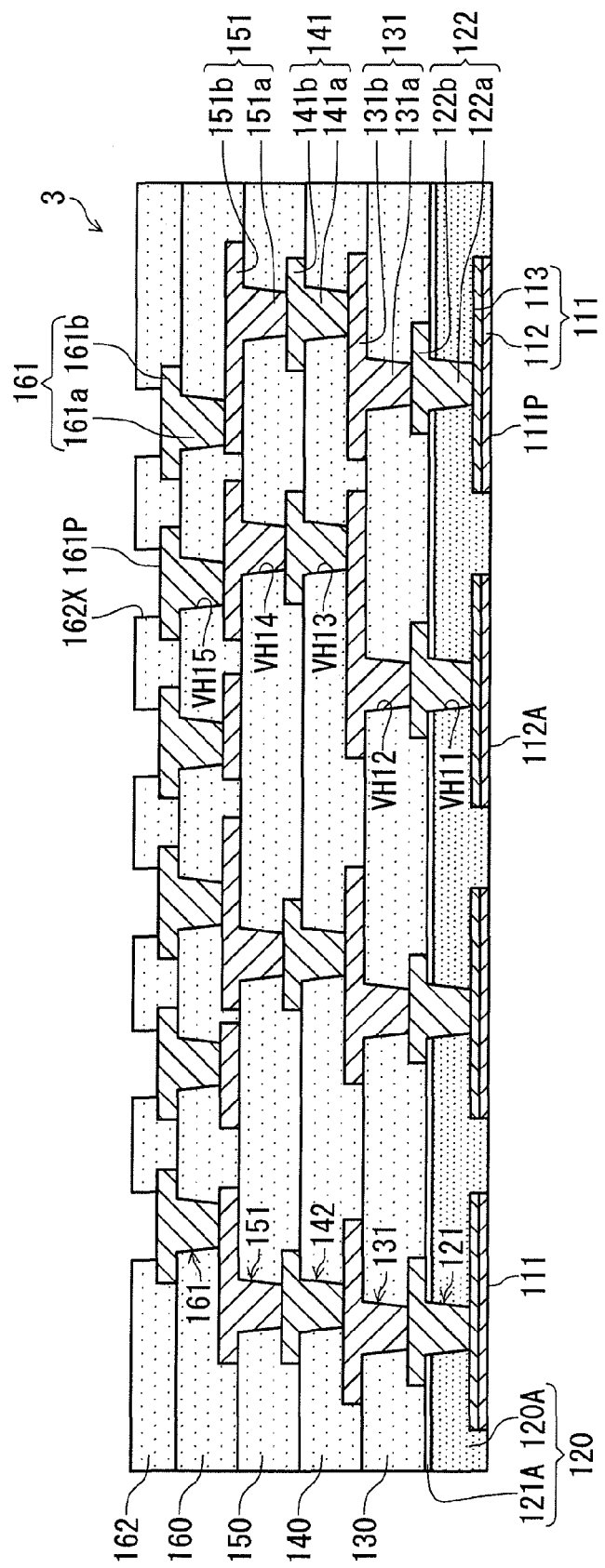
FIG. 14 is a schematic sectional view showing a wiring board according to a second embodiment.

As shown in FIG. 14, a wiring board 3 has a structure in which a first wiring layer 111, a first insulating layer 120, a second wiring layer 122, a second insulating layer 130, a third wiring layer 131, a third insulating layer 140, a fourth wiring layer 141, a fourth insulating layer 150, a fifth wiring layer 151, a fifth insulating layer 160 and a sixth wiring layer 161 are formed successively. In this manner, the wiring board 3 according to this embodiment has the form of a "coreless board" containing no support based material, similarly to the wiring board 1 according to the first embodiment.

Incidentally, metal such as copper or copper alloy can be used as each of the materials of the first to sixth wiring layers 122, 131, 141, 151 and 161.

In the wiring board 3, the first wiring layer 111 is formed as the lowermost layer in FIG. 14. The first wiring layer 111 has a first conductive layer 112, and a second conductive layer 113. For example, a conductive layer in which an Au film, a Pd film and an Ni film are formed successively in this order so that the Au film is exposed out of the wiring board 3 can be used as the first conductive layer 112. For example, a conductive layer containing a Cu layer or the like can be used as the second conductive layer 113.

Parts of the first wiring layer 111, that is, a first principal surface 112A (a lower surface in the drawing) of the first conductive layer 112 are exposed out of the first insulating layer 20 and serve as external connection pads 111P to which external connection terminals such as solder balls, lead pins, etc. used when the wiring board 3 is mounted in a mother board or the like are connected. That is, in this embodiment, a surface where the external connection pads 111P are formed is provided as an external connection terminal surface. In addition, in this embodiment, the first principal surface 112A of the first conductive layer 112 is on the same plane with the first principal surface (lower surface in the drawing) of the first insulating layer 120. Incidentally, the first wiring layer 111 per se exposed out of the first insulating layer 120 may be used as external connection terminals.

For example, the planer shape of the first wiring layer 111 exposed out of the first insulating layer 120 is circular. For example, the diameter of each circle can be set to be in a range of about 200 μm to about 1000 μm. For example, the pitch of the first wiring layer 111 exposed out of the first insulating layer 120 can be set to be in a range of about 500 μm to about 1200 μm. For example, the thickness of the first wiring layer 111 can be set to be in a range of about 10 μm to about 20 μm.

The first insulating layer 120 has an insulating layer 120A, and a contact layer 121A. The insulating layer 120A is formed so that the second principal surface (upper surface in the drawing) and side surfaces of the first wiring layer 111 are covered with the insulating layer 120A but the first principal surface 112A of the first wiring layer 111 is exposed. The insulating layer 120A is an insulating layer which has the same composition as the insulating layer 40A in the first embodiment, i.e. a reinforcing material-containing insulating layer. An epoxy-based insulating resin having thermosetting characteristic can be used as the material of the insulating layer 120A. Incidentally, the insulating resin is not limited to the resin having thermosetting characteristic but an insulating resin having photosensitivity can be used. For example, the thickness of the insulating layer 120A can be set to be in a range of about 30 μm to about 60 μm.

The contact layer 121A is formed on the insulating layer 120A so that the upper surface of the insulating layer 120A is covered with the contact layer 121A. The contact layer 121A is an insulating layer which has the same composition as the contact layer 41A in the first embodiment, i.e. an insulating layer which has a surface smoother (lower roughness) than the insulating layer 120A and which is higher in adhesion to a metal film (e.g. electroless plating) than the insulating layer 120A. For example, an insulating resin containing 30 vol % or more of an epoxy resin, and 1 to 50 vol % of an inorganic filler can be used as the material of the contact layer 121A.

For example, the surface roughness of the contact layer 121A is set to be in a range of 50 to 350 nm in terms of surface roughness Ra value. For example, the thickness of the contact layer 121 can be set to be in a range of about 0.5 µm to about 5 µm.

The second wiring layer 122 is formed on the first insulating layer 120. The second wiring layer 122 has via-wirings 122a packed in via-holes VH11 which are formed through the insulating layer 120A and the contact layer 121A to expose the upper surface of the first wiring layer 111, and wiring patterns 122b formed on the contact layer 121A. The via-wirings 122a are electrically connected to the first wiring layer 111 exposed in the bottoms of the via-holes VH11. Incidentally, each of the via-holes VH11 and the via-wirings 122a is tapered to have a shape having its diameter increasing as the position goes from the lower side (external connection terminal surface side) to the upper side (sixth wiring layer 161 side) in FIG. 14. For example, the thickness of the wiring patterns 122b of the second wiring layer 122 can be set to be in a range of about 20 µm to about 35 µm.

The third to sixth wiring layers 131, 141, 151 and 161 are formed with interposition of the second to fifth insulating layers 130, 140, 150 and 160 and interlayer-connected through via-wirings 131a, 141a, 151a and 161a packed in via-holes VH12, VH13, VH14 and VH15 formed in the insulating layers 130, 140, 150 and 160 respectively.

Incidentally, an epoxy-based insulating resin having thermosetting characteristic can be used as each of the materials of the second to fifth insulating layers 130, 140, 150 and 160. Incidentally, the insulating resin is not limited to the resin having thermosetting characteristic but an insulating resin having photosensitivity can be used. For example, the thicknesses of the second to fifth insulating layers 130, 140, 150 and 160 can be set to be in a range of about 15 µm to about 35 µm.

The third wiring layer 131 has via-wirings 131a electrically connected to the wiring patterns 122b of the second wiring layer 122, and wiring patterns 131b electrically connected to the via-wirings 131a. The fourth wiring layer 141 has via-wirings 141a electrically connected to the wiring patterns 131b, and wiring patterns 141b electrically connected to the via-wirings 141a. The fifth wiring layer 151 has via-wirings 151a electrically connected to the wiring patterns 141b, and wiring patterns 151b electrically connected to the via-wirings 151a. The sixth wiring layer 161 has via-wirings 161a electrically connected to the wiring patterns 151b, and wiring patterns 161b electrically connected to the via-wirings 161a. Each of the via wirings 131a, 141a, 151a and 161a of the third to sixth wiring layers 131, 141, 151 and 161 is tapered to have a shape having its diameter increasing as the position goes from the lower side (external connection pad 111P side) to the upper side (wiring pattern 161b side) in FIG. 14. Specifically, each of the via-wirings 131a, 141a, 151a and 161a is shaped like a frustum of a circular cone so that the diameter of an end surface on the external connection pad 111P side is smaller than the diameter of an end surface on the wiring pattern 161b side.

A solder resist layer 162 is formed on the fifth insulating layer 160. For example, an epoxy-based insulating resin can be used as the material of the solder resist layer 162. For example, the thickness of the solder resist layer 162 can be set to be in a range of about 15 µm to about 35 µm.

Opening portions 162X for exposing parts of the wiring patterns 161b as electrode pads 161P are formed in the solder resist layer 162. The electrode pads 161P are configured so that, for example, a semiconductor chip or the like can be electrically connected to the electrode pads 161P. That is, in this embodiment, a surface where the electrode pads 161P are formed is provided as a chip mounting surface. Incidentally, if necessary, a metal layer may be formed on each of the wiring patterns 161b of the sixth wiring layer 161 exposed out of the opening portions 162X so that a semiconductor chip can be connected to the metal layer. An Au layer, an Ni/Au layer (a metal layer formed in such a manner that an Ni layer and an Au layer are formed in this order), an Ni/Pd/Au layer (a metal layer formed in such a manner that an Ni layer, a Pd layer and an Au layer are formed in this order), etc. can be listed as examples of the metal layer.

The planer shape of each of the opening portions 162X (electrode pads 161P) of the solder resist layer 162 is, for example, circular. For example, the diameter of each circle can be set to be in a range of about 40 µm to about 120 µm. For example, the pitch of the electrode pads 161P can be set to be in a range of about 100 µm to about 200 µm.

Method of Manufacturing Wiring Board According to Second Embodiment

A method of manufacturing the wiring board 3 will be described below.

First, for production of the wiring board 3, a support board 180 is prepared as shown in FIG. 15A. For example, a metal plate or metal foil can be used as the support board 180. In this embodiment, for example, copper foil is used as the support board 180. For example, the thickness of the support board 180 is in a range of 35 µm to 100 µm. Successively, a resist layer 181 having opening portions 181X corresponding to the shape of the first wiring layer 111 is formed on one surface (upper surface in the drawing) of the support board 180. Then, while the resist layer 181 is used as a plating mask, electrolytic plating using the support board 180 as a plating power feeding layer is applied to the upper surface of the support board 180. Specifically, an electrolytic plating method is applied to the upper surface of the support board 180 exposed out of the opening portions 181X of the resist layer 181 to thereby laminate the first conductive layer 112 and the second conductive layer 113 successively in the opening portions 181X to form the first wiring layer 111. For example, when the first conductive layer 112 has a structure in which an Au film, a Pd film and an Ni film are formed successively in this order, and the second conductive layer 113 is a Cu layer, an Au film, a Pd film and an Ni film are first formed in this order by an electrolytic plating method using the support board 180 as a plating power feeding layer to thereby form the first conductive layer 112. A Cu layer is then formed on the first conductive layer 112 by an electrolytic plating method using the support board 180 as a plating power feeding layer to thereby form the second conductive layer 113.

Then, in the step shown in FIG. 15B, the resist layer 181 shown in FIG. 15A is removed. On the other hand, an insulating layer 120B serving as an insulating layer 120A (see FIG. 14) is prepared, that is, a reinforcing material-containing insulating layer 120B made of woven or unwoven fabric of glass, aramid or LCP (Liquid Crystal Polymer) fiber impregnated with an unhardened thermosetting resin (such as an epoxy-based resin or a polyimide-based resin) is prepared. A B-stage layer is used as the insulating layer 120B. For example, the thickness of the insulating layer 120B can be set to be in a range of 30 µm to 80 µm.

In the step shown in FIG. 15B, a structure 182A in which an insulating layer 121B serving as a contact layer 121A (see FIG. 14) is bonded to a carrier 182 is prepared. For example, an insulating resin containing 30 vol % or more of an unhardened epoxy resin, and 1 to 50 vol % of an inorganic filler can be used as the material of the insulating layer 121B. A semi-hardened state layer is used as the insulating layer 121B. For example, the thickness of the insulating layer 121B can be set to be in a range of about 1 μm to about 6 μm. For example, copper foil can be used as the carrier 182 for carrying the insulating layer 121B. For example, the thickness of the carrier 182 can be set to be in a range of about 2 μm to about 18 μm.

In the step shown in FIG. 15B, the insulating layer 120B and the structure 182A are disposed sequentially from bottom on the upper surface side of the structure in which the first wiring layer 111 is formed on the upper surface of the support board 180. On this occasion, the structure 182A is disposed in a state where the insulating layer 121B faces downward so that the insulating layer 121B becomes opposite to the insulating layer 120B. Then, the structure in which the first wiring layer 111 is formed on the upper surface of the support board 180, the insulating layer 120B and the structure 182A are pressed while heated at a temperature of about 190° C. to about 250° C. in a vacuum atmosphere from both sides. Consequently, as shown in FIG. 15C, the insulating layers 120B and 121B are hardened so that the insulating layer 120A and the contact layer 121A are formed on the support board 180 and the first wiring layer 111. Moreover, as the insulating layers 120B and 121B are hardened, the support board 180 and the first wiring layer 111 are bonded to the insulating layer 120A while the insulating layer 120A is bonded to the contact layer 121A.

Successively, in the step shown in FIG. 15C, the carrier 182 (copper foil) shown in FIG. 15B is selectively removed from the contact layer 121A by etching.

Figures 16A, 16B, 16C:
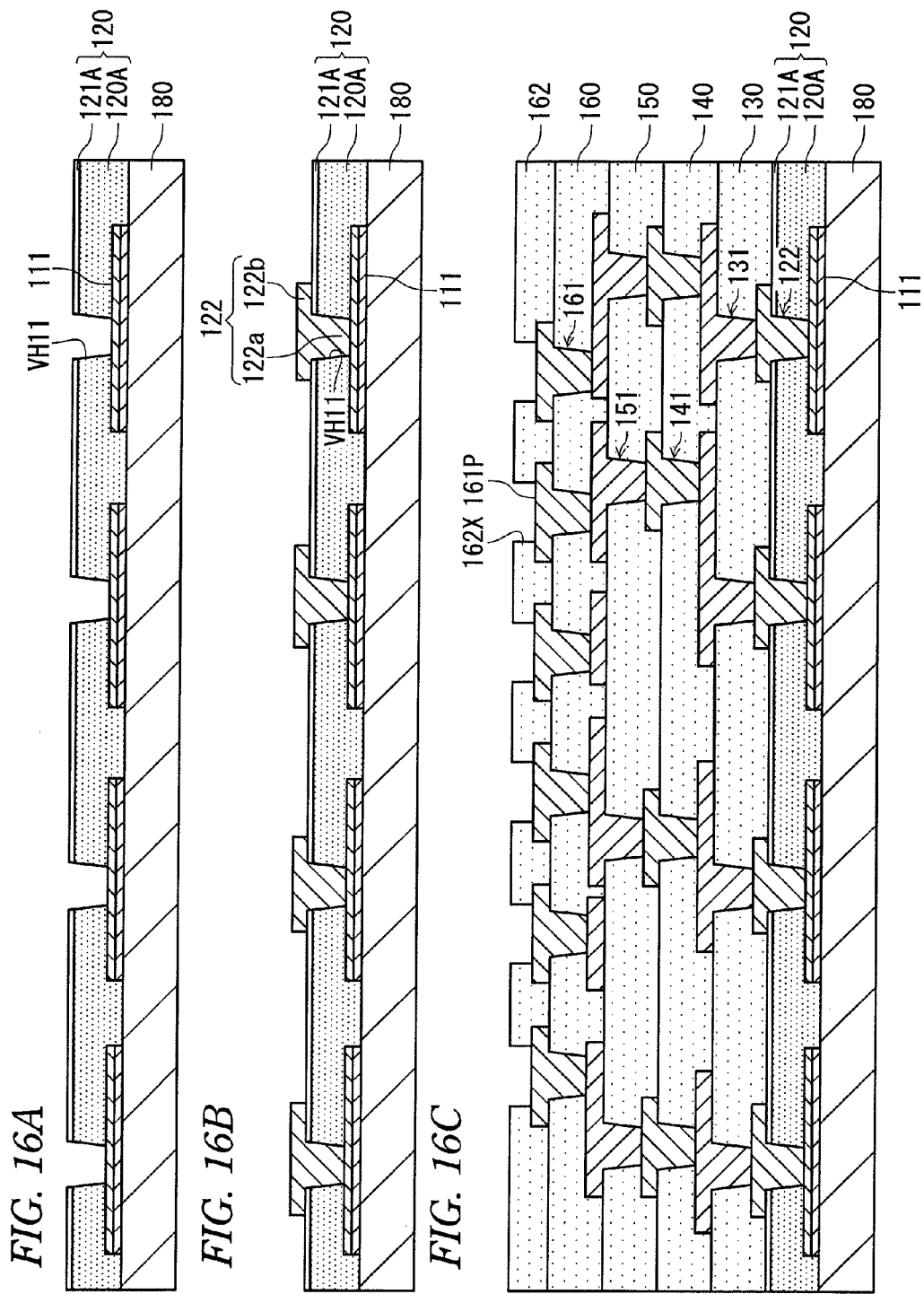
FIGS. 16A to 16C are schematic sectional views showing the method of manufacturing the wiring board according to the second embodiment.

Then, in the step shown in FIG. 16A, via-holes VH11 are formed in predetermined places of the insulating layer 120A and the contact layer 121A so that the upper surface of the first wiring layer 111 is exposed. For example, the via-holes VH11 can be formed by a laser machining method using a carbon dioxide laser, a UV-YAG laser or the like.

When the via-holes VH11 are formed by a laser machining method, desmear processing is then performed to remove a resin residue of the insulating layer 120A and the contact layer 121A deposited on the upper surface of the first wiring layer 111 exposed in the bottoms of the via-holes VH11. For example, this desmear processing can be performed by a permanganate method or the like. Incidentally, the roughness of the upper surface of the contact layer 121A after the desmear processing is kept at a low value of about 50-350 nm in terms of surface roughness Ra value.

Then, in the step shown in FIG. 16B, a second wiring layer 122 is formed on the first insulating layer 120. The second wiring layer 122 can be formed by a semi-additive method in the same manner as in the steps described with reference to FIGS. 6A to 7A.

That is, a seed layer (not shown) of copper or the like is formed on the upper surface of the first wiring layer 111 exposed in the bottoms of the via-holes VH11, the inner wall surfaces of the via-holes VH11 and the upper surface of the contact layer 121A by an electroless plating method or a sputtering method. On this occasion, the seed layer is formed on the upper surface (low roughness surface) of the contact layer 121A so that the seed layer adheres to the contact layer 121A with a high adhesion strength. Then, a resist layer (not shown) having opening portions corresponding to the shape of the second wiring layer 122 is formed on the seed layer. Successively, a wiring layer (not shown) of copper or the like is formed in the opening portions of the resist layer by an electrolytic plating method using the seed layer as a power feeding layer. Then, after the resist layer is removed, parts of the seed layer not covered with the wiring layer are removed by etching using the wiring layer as a mask. Consequently, the second wiring layer 122 having via-wirings 122a packed in the via-holes VH11, and wiring patterns 122b formed on the contact layer 121A is formed on the first insulating layer 120.

Then, in the step shown in FIG. 16C, the steps shown in FIGS. 3D to 4A are repeated again so that insulating layers and wiring layers are formed alternately. That is, as shown in FIG. 16C, the second insulating layer 130 is formed on the contact layer 121A and the second wiring layer 122, and the third wiring layer 131 is formed on the second insulating layer 130. Similarly, the third insulating layer 140, the fourth wiring layer 141, the fourth insulating layer 150, the fifth wiring layer 151, the fifth insulating layer 160 and the sixth wiring layer 161 are formed in this order by lamination.

Then, in the step shown in FIG. 16C, a solder resist layer 162 having opening portions 162X for exposing electrode pads 161P determined in required places of the sixth wiring layer 161 is formed on the fifth insulating layer 160 and the sixth wiring layer 161. Consequently, parts of the sixth wiring layer 161 are exposed as electrode pads 161P out of the opening portions 162X of the solder resist layer 162. Then, the support board 180 is removed so that the wiring board 3 shown in FIG. 14 can be produced.

According to the aforementioned embodiment, the following effects can be obtained in addition to the effects (1) to (4) of the first embodiment.

(1) Only one interlayer insulating layer which is the outermost layer on the external connection pad 111P side is provided as the insulating layer 120 having a reinforcing material-containing insulating layer 120A and a contact layer 121A. This reason will be described below.

First, it is general that the wiring layer (the first wiring layer 111 in this case) used as external connection pads 111P has a high remaining copper ratio whereas the wiring layer (the sixth wiring layer 161 in this case) used as electrode pads 161P has a low remaining copper ratio. Although the ratio is referred to as the remaining copper ratio in this embodiment on the assumption that the metal layer is made of copper, the metal layer may be made of another metal than copper.

Warping occurs in the wiring board 3 easily in accordance with the difference in remaining copper ratio as described above. Specifically, under an environment of normal temperature lower than the glass transition temperature Tg of an interlayer insulating layer, a layer having a low remaining copper ratio, that is, a layer containing a large amount of an insulating resin is so shrinkable that the electrode pad 161P side (chip mounting surface side) has a tendency toward warping concavely. On the other hand, under an environment of high temperature higher than the glass transition temperature Tg of the interlayer insulating layer, a layer having a low remaining copper ratio is warped toward a layer having a high remaining copper ratio, that is, the external connection pad 111P side (external connection terminal surface side) has a tendency toward warping concavely.

On the contrary, this embodiment is configured so that a reinforcing material-containing insulating layer 120A is provided in the interlayer insulating layer (the first insulating layer 120 in this case) which is the outermost layer on the external connection pad 111P side, that is, the first insulating layer 120 easily warped. Thus, the rigidity of the first insulating layer 120 can be improved so that warping of the wiring board 3 can be reduced effectively. That is, for example, when the wiring board 3 is warped under a high temperature environment, improvement in the rigidity of the insulating layer 120 as an external connection terminal surface-side outermost layer concavely warped can work effectively against stress warping the wiring board 3 to provide a large effect of reducing warping of the wiring board 3.

Moreover, even when the temperature of the wiring board 3 becomes higher than the glass transition temperature Tg of the other insulating layers 130, 140, 150 and 160 than the insulating layer 120A, the rigidity of the reinforcing material contained in the insulating layer 120A can suppress occurrence of warping to stabilize the behavior under a high temperature environment because the glass transition temperature Tg of the insulating layer 120A is higher than the glass transition temperature Tg of the other insulating layers 130, 140, 150 and 160.

(2) The reinforcing material-containing insulating layer 120A becomes thicker than the other insulating layers (e.g. the second insulating layer 130) containing no reinforcing material. Accordingly, the via-holes VH11 formed in the first insulating layer 120 become deeper than the via-holes VH15 formed in the fifth insulating layer 160, and the diameter at an opening end (the diameter on the solder resist layer 162 side) becomes large. That is, the via-holes VH11 become larger in volume than the via-holes VH15. However, the large volumes of the via-holes VH11 do not bring any trouble because the via-holes VH11 are provided on the external connection terminal surface side and a design rule on the external connection terminal surface side is looser than that on the chip mounting surface side so that the pitch of the external connection pads 111P can be made wider than that of the electrode pads 161P. That is, even when the reinforcing material-containing insulating layer 120A is provided in the insulating layer 120 which serves as an outermost layer on the external connection pad 111P side as described above, required via-holes VH11 and wiring layers 111, 122, etc. can be formed without loosening the design rule.

Incidentally, the respective embodiments can be carried out based on the following forms which have been changed properly.

Modification of Second Embodiment

The second embodiment is configured so that an insulating layer 120 having a reinforcing material-containing insulating layer 120A and a contact layer 121A low in roughness and improved in adhesion to electroless plating is provided as the outermost interlayer insulating layer on the external connection terminal surface side. The invention is not limited thereto as long as at least one of built-up interlayer insulating layers in the wiring board is the insulating layer 120 having the insulating layer 120A and the contact layer 121A. Accordingly, the position where each insulating layer 120 is formed and the number of such insulating layers 120 are not particularly limited.

Figure 17:
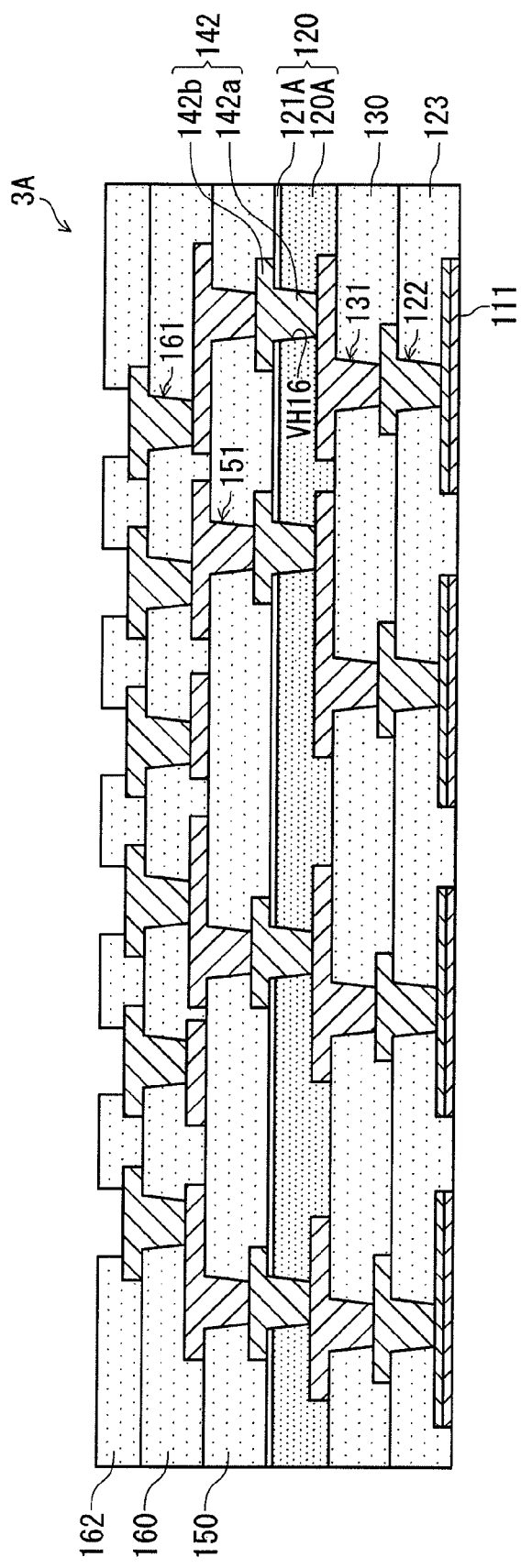
FIG. 17 is a schematic sectional view showing a wiring board according to a modification of the second embodiment.

For example, as shown in FIG. 17, the interlayer insulating layer near the center in the direction of lamination may be replaced by the insulating layer 120 having the reinforcing material-containing insulating layer 120A and the contact layer 121A. That is, in a wiring board 3A, the third insulating layer 140 in the wiring board 3 shown in FIG. 14 is replaced by the insulating layer 120, and the insulating layer 120 in the wiring board 3 is replaced by an insulating layer 123 containing no reinforcing material. In the wiring board 3A, a wiring layer 142 formed on the insulating layer 120 has via-wirings 142a packed in via-holes VH16 formed through the reinforcing material-containing insulating layer 120A and the contact layer 121A to expose the upper surface of the wiring layer 131, and wiring patterns 142b formed on the contact layer 121A. By such a structure, the same effect as in the first embodiment can be obtained.

(Other Modifications)

Although the respective embodiments have been described in an example in which one wiring board 1 or 3 is produced on a support board 80 or 180, a process of manufacturing a member to be formed as a plurality of wiring boards 1 or 3 on a support board 80 or 180 and dividing the member to obtain the plurality of wiring boards 1 or 3 individually may be used.

In the respective embodiments, a reinforcing material-containing insulating resin is used as the material of the insulating layer 40A or 120A. The invention is not limited thereto. For example, an epoxy-based insulating resin containing about 20% to about 70% of a filler such as silica ($SiO_2$) may be used as the material of the insulating layer 40A or 120A. In this case, the filler content can be adjusted so that the thermal expansion coefficient of the insulating layer 40A or 120A is adjusted to be close to the thermal expansion coefficient (e.g. about 17 ppm/° C.) of the wiring layer (for example, the thermal expansion coefficient decreases as the filler content increases).

In the respective embodiments, the insulating layer 41B or 121B to be formed as the contact layer 41A or 121A is bonded to the carrier 82 or 182 when the insulating layer 40A or 120A and the contact layer 41A or 121A are formed collectively. The invention is not limited thereto. For example, a structure in which an insulating layer 41B and an insulating layer 40B are provided on a carrier 82 may be prepared and the carrier 82 may be removed after the structure is formed on a wiring layer and an insulating layer as lower layers. Alternatively, a structure in which an insulating layer 41B is provided on an insulating layer 40B may be prepared and the structure may be formed on a wiring layer and an insulating layer as lower layers.

In the respective embodiments, wiring layers and insulating layers are mainly formed on one side (one surface) of a support board by a build-up method and the support board is finally removed to produce a coreless wiring board. The invention is not limited thereto. For example, wiring layers and insulating layers may be mainly formed on both sides (one surface and the other surface) of a support board by a build-up method and the support board may be finally removed to produce a plurality of coreless wiring boards. In this case, wiring layers and insulating layers are formed successively on each of one surface and the other surface of the support board from the chip mounting surface side in the same manner as in the process shown in FIGS. 3A-3E, 4A-4B, 5A-5C, 6A-6C and 7A-7B, and the support board is finally removed. Or wiring layers and insulating layers are formed successively on each of one surface and the other surface of the support board from the external connection terminal surface side in the same manner as in the process shown in FIGS. 15A-15C and 16A-16C, and the support board is finally removed.

Although the respective embodiments have been described in the case where a semiconductor chip 70 is mounted on the wiring board 1, the body to be mounted is not limited to the semiconductor chip 70. For example, the invention can be also applied to a package (package on package) having a structure in which another wiring board is piled up on the wiring board 1.

In the respective embodiments, the number of layers in the wiring board 1 or 3, the layout of wirings or the form of mounting the semiconductor chip 70 (e.g. flip chip mounting, mounting due to wire bonding or combination thereof) can be modified or changed variously.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A wiring board comprising:
   a first wiring layer;
   a first insulating layer formed on the first wiring layer and comprising a reinforcing material therein, the first insulating layer having a first opening;
   a contact layer formed on the first insulating layer and having a second opening communicated with the first opening, wherein the first wiring layer is exposed through the first and second openings; and
   a second wiring layer comprising a via and a wiring pattern connected to the via, wherein the wiring pattern is formed on the contact layer, and the via is filled in the first and second openings,
   wherein an adhesion property between the contact layer and the wiring pattern is higher than an adhesion property between the first insulating layer and the wiring pattern,
   a thickness of the contact layer is smaller than that of the first insulating layer, and
   the contact layer is higher in surface smoothness than the first insulating layer.

2. The wiring board of claim 1, wherein a surface of the contact layer on which the wiring pattern is formed has a surface roughness of 50 nm to 350 nm.

3. The wiring board of claim 1, wherein the contact layer is an insulating layer and comprises: a thermosetting resin containing an epoxy resin as a main component; and an inorganic filler.

4. The wiring board of claim 1, wherein the thickness of the contact layer is smaller than 10% of that of the first insulating layer.

5. The wiring board of claim 1, wherein the first insulating layer has a first surface on which the contact layer is formed and a second surface opposite to the first surface, and
   wherein the wiring board further comprises:
   a first multilayer wiring structure comprising a plurality of insulating layers and a plurality of wiring layers and formed on the first surface of the first insulating layer via the contact layer; and
   a second multilayer wiring structure comprising a plurality of insulating layers and a plurality of wiring layers and formed on the second surface of the first insulating layer.

6. The wiring board of claim 1,
   wherein the first insulating layer comprises:
   a first surface on which the contact layer is formed; and
   a second surface opposite to the first surface and serving as an outer surface of the wiring board, and
   wherein the first wiring layer serves as an electrode pad, and the first wiring layer comprises:
   a first surface exposed through the first and second openings; and
   a second surface opposite to the first surface,
   wherein the first wiring layer is embedded in the first insulating layer while the second surface of the first wiring layer is exposed from the second surface of the first insulating layer.

7. The wiring board of claim 1, wherein the first insulating layer is formed by impregnating the reinforcing material made of a woven or unwoven fabric with a resin.

8. The wiring board of claim 1, wherein a surface, opposite to the first insulating layer, of the contact layer has a roughness in a range of 50 nm-350 nm.

9. The wiring board of claim 1, wherein the thickness of the contact layer is smaller than that of the wiring pattern.

10. The wiring board of claim 3, wherein a peeling strength between the contact layer and the wiring pattern is 850N/m or more.

11. The wiring board of claim 3, wherein the contact layer comprises: the thermosetting resin at a ratio of 30 vol % to 65 vol % thereof; and the inorganic filler at a ratio of 1 vol % to 30 vol % thereof.

12. The wiring board of claim 6, wherein the second surface of the first wiring layer is flush with the second surface of the first insulating layer.

13. A wiring board comprising:
    a plurality of multilayer wiring structures stacked one on top of another, each of the plurality of multilayer wiring structures comprising:
    an insulating layer comprising a reinforcing material therein, the insulating layer having a first opening;
    a contact layer formed on the insulating layer and having a second opening communicated with the first opening; and
    a wiring layer comprising a via and a wiring pattern connected to the via, wherein the wiring pattern is formed on the contact layer, and the via is filled in the first and second openings,
    wherein an adhesion property between the contact layer and the wiring pattern is higher than an adhesion property between the insulating layer and the wiring pattern, a thickness of the contact layer is smaller than that of the insulating layer, and the contact layer is higher in surface smoothness than the first insulating layer.

14. The wiring board of claim 13, wherein a surface, opposite to the first insulating layer, of the contact layer has a roughness in a range of 50 nm-350 nm.

15. The wiring board of claim 13, wherein the thickness of the contact layer is smaller than that of the wiring pattern.

* * * * *